United States Patent
Kamei et al.

(10) Patent No.: US 6,914,815 B2
(45) Date of Patent: *Jul. 5, 2005

(54) NONVOLATILE SEMICONDUCTOR STORAGE DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 419 days.

This patent is subject to a terminal disclaimer.

(21) Appl. No.: 10/157,897

(22) Filed: May 31, 2002

(65) Prior Publication Data

US 2003/0072194 A1 Apr. 17, 2003

(30) Foreign Application Priority Data

Jun. 4, 2001 (JP) ........................................ 2001-168373

(51) Int. Cl.[7] ............................................. G11C 16/04
(52) U.S. Cl. ............................. 365/185.11; 365/185.23; 365/185.17; 365/230.03
(58) Field of Search ....................... 365/185.11, 185.23, 365/185.17, 230.03

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,317,349 B1 * | 11/2001 | Wong ........................... 365/49 |
| 6,646,916 B2 * | 11/2003 | Kamei .................... 365/185.11 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. Appl. No. 09/955,158, filed Sep. 19, 2001, Kanai et al.
U.S. Appl. No. 09/955,160, filed Sep. 19, 2001, Kanai et al.
U.S. Appl. No. 10/115,913, filed Apr. 5, 2002, Kamei.
U.S. Appl. No. 10/115,956, filed Apr. 5, 2002, Kamei.
U.S. Appl. No. 10/153,611, filed May 24, 2002, Owa.

(Continued)

*Primary Examiner*—Connie C. Yoha
(74) *Attorney, Agent, or Firm*—Oliff & Berridge PLC

(57) ABSTRACT

A nonvolatile semiconductor storage device includes a memory cell array region in which a plurality of memory cells arranged in a row direction and a column direction, each of the memory cells having first and second MONOS memory cells and being controlled by one word gate and two control gates. The memory cell array region includes a plurality of sectors which are formed by dividing the memory cell array region in the row direction, and the longitudinal direction of the sectors is the column direction. Each of the plurality of sectors includes small blocks which are formed by dividing each of the sectors in the column direction. First to fourth control gate line drivers are arranged in each of local driver areas between which two adjacent small blocks are disposed. The first to fourth control gate drivers set the potentials of the first and second control gates within one corresponding small block, independently of the other small block.

12 Claims, 29 Drawing Sheets

OTHER PUBLICATIONS

U.S. Appl. No. 10/153,686, filed May 24, 2002, Owa.
U.S. Appl. No. 10/153,736, filed May 24, 2002, Owa.
U.S. Appl. No. 10/157,896, filed May 31, 2002, Kamei et al.
Hayashi et al., "Twin MONOS Cell with Dual Control Gates", IEEE VLSI Technology Digest of Technical Papers, 2000.
Chang et al., "A New SONOS Memory Using Source–Side Injection for Programming", IEEE Electron Device Letters, vol. 19, No. 7, pp253–255, Jul. 1998.
Chen et al., A Novel Flash Memory Device with S Plit Gate Source Side Injection and ONO Charge Storage Stack (SPIN), VLSI Technology Digest of Technical Papers, pp63–64, 1997.

* cited by examiner

Erase (Selected Block)

NONVOLATILE SEMICONDUCTOR STORAGE DEVICE

Japanese Patent Application No. 2001-168373, filed on Jun. 4, 2001, is hereby incorporated by reference in its entirety.

BACKGROUND OF THE INVENTION

The present invention relates to a nonvolatile semiconductor storage device constructed of memory cells each including two nonvolatile memory elements which are controlled by one word gate and two control gates.

Known as a nonvolatile semiconductor device is the MONOS (Metal-Oxide-Nitride-Oxide-Semiconductor or -Substrate) type wherein the gate insulator layer between a channel and a gate is formed of a stacked structure consisting of a silicon oxide film, a silicon nitride film and a silicon oxide film, and wherein electric charges are trapped in the silicon nitride film.

The MONOS type nonvolatile semiconductor storage device is disclosed in a publication, Y. Hayashi, et al.: 2000 Symposium on VLSI Technology, Digest of Technical Papers, p.122 to p.123. The publication teaches a MONOS flash memory cell including two nonvolatile memory elements (also termed "MONOS memory elements or cells") which are controlled by one word gate and two control gates. That is, one flash memory cell has two trap sites for charges.

A plurality of MONOS flash memory cells each having such a structure are arranged in each of a row direction and a column direction, thereby to construct a memory cell array region.

Two bit lines, one word line and two control gate lines are required for driving the MONOS flash memory cell. In driving a large number of memory cells, however, such lines can be connected in common in a case where even the different control gates are set at the same potential.

The operations of the flash memory of this type include erasing, programming and reading data. Usually, each of the operations of programming and reading data is performed simultaneously in selected cells (selected nonvolatile memory elements) of 8 bits or 16 bits.

Here in the MONOS flash memory, a plurality of MONOS flash memory cells which are not isolated from one another are connected to one word line. Accordingly, not only the voltages of the MONOS flash memory cell having a certain specified selected cell, but also those of the MONOS flash memory cells adjacent thereto must be appropriately set in order to program data in the selected cell.

In this regard, the disturbance of data poses a problem in the nonvolatile memory of this type. The "disturbance of data" signifies a phenomenon in which, when data is programmed or erased by applying high potentials to the control gate line and bit line of the selected cell, the high potentials are also applied to an unselected cell (unselected nonvolatile memory element) by the shared wiring lines, and such a state is repeated every programming or erasing operation, whereby the unselected cell is programmed or erased, so that the data of the unselected cell is disturbed.

In order to avoid such a situation, each control gate line can be furnished with a selection gate circuit so as to apply the high potential only to the cell within a selected sector, and to prevent the high potential from being applied to the cell within an unselected sector.

With this contrivance, however, an area is occupied due to the selection gate circuits, and a high density of integration of memory cells is hampered. Further, when a voltage drop arises in the selection gate circuit, the component of the voltage drop needs to be fed in superposition in order to feed the high potential to the cell of the selected sector in the program mode. In consequence, the low voltage drive of the storage device is hampered, and the contrivance is unsuited to an equipment of which a low power consumption is required, especially a portable equipment.

Besides, even when the high potential is applied within only the selected sector as stated above, it is also applied to the unselected cell within the selected sector, and the disturbance in the unselected cell within the selected sector is unavoidable especially in the data erase mode.

BRIEF SUMMARY OF THE INVENTION

The present invention may provide a nonvolatile semiconductor storage device which can avoid the disturbance of data, not only in an unselected cell within an unselected sector, but also in an unselected cell within a selected sector, in a program mode or erase mode in a selected cell, without requiring the selection gate circuit of each control gate line, whereby a high density of integration can be achieved.

The present invention may further provide a nonvolatile semiconductor device which avoids a voltage drop by dispensing with the selection gate circuit for the control gate line, whereby a power consumption can be lowered.

The present invention may still further provide a nonvolatile semiconductor device which reduces a load by shortening each control gate line, whereby especially a data reading operation can be heightened in speed, and a power consumption can be lowered.

One aspect of the present invention relates to a nonvolatile semiconductor device comprising:

a memory cell array region in which a plurality of memory cells are arranged in a row direction and a column direction, each of the memory cells having first and second nonvolatile memory elements and being controlled by one word gate and first and second control gates; and a control gate drive section which drives the first and second control gates of each of the memory cells within the memory cell array region, wherein the memory cell array region includes a plurality of sector areas which are formed by dividing the memory cell array region in the row direction, wherein each of the plurality of sector areas includes a plurality of block areas which are formed by dividing each of the sector areas in the column direction, and wherein the control gate drive section includes a plurality of control gate drivers each of which corresponds to each of the plurality of block areas, and each of the plurality of control gate drivers sets potentials of the first and second control gates in corresponding one of the block areas, independently of the other block areas.

According to the one aspect of the present invention, in the case of, for example, programming one selected cell of memory cells in a certain selected block area within a selected sector, only the potential of the control gate of the memory cell (including a selected cell and an unselected cell) in the selected block area can be set at a program potential by a corresponding control gate driver. In unselected block areas within the selected sector and unselected sectors, potentials other than the program potential can be set by control gate drivers corresponding to the unselected block areas, so that data are not disturbed in cells included in the unselected block areas. Moreover, this advantage can be achieved without employing selection gate circuits for control gate lines, so that memory cells can be highly integrated. Besides, no voltage drop in the selection gate circuits for the control gate lines occurs, and the nonvolatile semiconductor device is permitted to be driven with low voltages and can be effectively utilized especially as the memory of a portable equipment.

Since the data programming is executed in, for example, units of one byte, a high potential can be applied to the unselected cell in the selected block. However, the sector including the selected block is collectively erased without fail before the data programming, and the number of times which the same block area is programmed after erasing data is limited, so that the disturbance of data can may be reduced.

In the one aspect of the present invention, each of the plurality of block areas may be provided with first to fourth control gate lines respectively connected with every fourth line among sub control gate lines, each of the sub control gate lines connecting the first control gate of one of the memory cells with the second control gate of adjacent memory cell among the memory cells arranged in the row direction. In this case, each of the plurality of block areas may include first to fourth control gate drivers which drive the first to fourth control gate lines, respectively.

In order to drive the memory cells, it is necessary to apply predetermined voltages to the respective control gates of one of cells (selected cell: nonvolatile memory element) and the other cell (opposite cell: nonvolatile memory element) in the memory cell selected in a data read or program mode, and to feed an OFF voltage for unselected states to the control gate of the unselected memory cell adjacent to the selected memory cell in the row direction. For this purpose, four control gate drivers may be disposed in each of the block areas.

The plurality of control gate drivers may be disposed in at least one local driver area adjacent to the block areas in the row direction. Thus, the length of each control gate line can be shortened, and the load of the control gate line can be reduced. Accordingly, especially, speed of a data reading operation can be increased while decreasing power consumption.

A word line driver may be disposed in the local driver area, the word line driver driving a word line connected to the word gate of each of the memory cells arranged in the row direction in each of the block areas. Even when the word line is shared with another sector, the problem of the disturbance does not occur. With the above configuration, the word line can be shortened to reduce its load, whereby a high speed operation can be achieved.

A plurality of sub bit lines which extend in the column direction may be provided in each of the plurality of block areas; and a plurality of main bit lines may be formed extending over the plurality of block areas in the column direction, and respectively connected to the plurality of sub bit lines in each of the plurality of block areas. In this case, a plurality of bit line selection switching elements, each selecting connection or non-connection, may be disposed at respective connection points between the main bit lines and the sub bit lines. In the one aspect of the present invention, no disturbance occurs even when the bit line is shared with another block area. If the sub bit line is selected through the bit line selection switching element for every block area, the load of the bit line can be reduced to achieve a high speed operation.

A bit line selection driver, which drives the bit line selection switching elements arranged in the block areas, may be disposed in the local driver area. Thus, the operating speed can be further heightened.

The block areas in an even-numbered sector area among the sector areas and the block areas in an odd-numbered sector area among the sector areas may be disposed adjacent each other in the row direction between two of the local driver areas among the local driver areas.

In this case, a plurality of word lines may be respectively formed extending over the block areas in the even-numbered sector area and the block areas in the odd-numbered sector area, so that each of the word lines maybe shared by two sectors.

In this case, a first word line driver which drives part of the plurality of word lines shared by two sectors may be disposed in one of the local driver areas adjacent to the block areas in the odd-numbered sector area, and a second word line driver which drives the other part of the plurality of word lines shared by two sectors may be disposed in another of the local driver areas adjacent to the block areas in the even-numbered sector area. Thus, the number of the word line drivers which are disposed in one local driver area decreases, so that layout is facilitated.

The first word line driver and the second word line driver may be respectively connected with every second line among the word lines shared by two sectors arranged in the column direction. Thus, the arranging pitch of the word line drivers which are arranged in each local driver area can be doubled in the column direction, so that wiring layout is facilitated.

The nonvolatile semiconductor storage device may include: a plurality of first bit line selection switching elements and a plurality of second bit line selection switching elements, the first and second bit line selection switching elements respectively connected to every second line among a plurality of sub bit lines arranged in the block areas within the odd-numbered sector area and the block areas within the even-numbered sector area; a first bit line selection driver which drives the plurality of first bit line selection switching elements is disposed in one of the local driver areas which is adjacent to the block areas in the odd-numbered sector area; and a second bit line selection driver which drives the plurality of second bit line selection switching elements is disposed in another of the local driver areas which is adjacent to the block areas in the even-numbered sector area. In this way, the first and second bit line selection drivers can be shared by the two sectors.

Each of the first and second nonvolatile memory elements may include an ONO film formed of an oxide film (O), a nitride film (N) and an oxide film (O), as a trap site for electric charges. However, the nonvolatile memory elements are not limited to such as structure, and other structures can be adopted.

DETAILED DESCRIPTION OF THE EMBODIMENT

Figure 1:
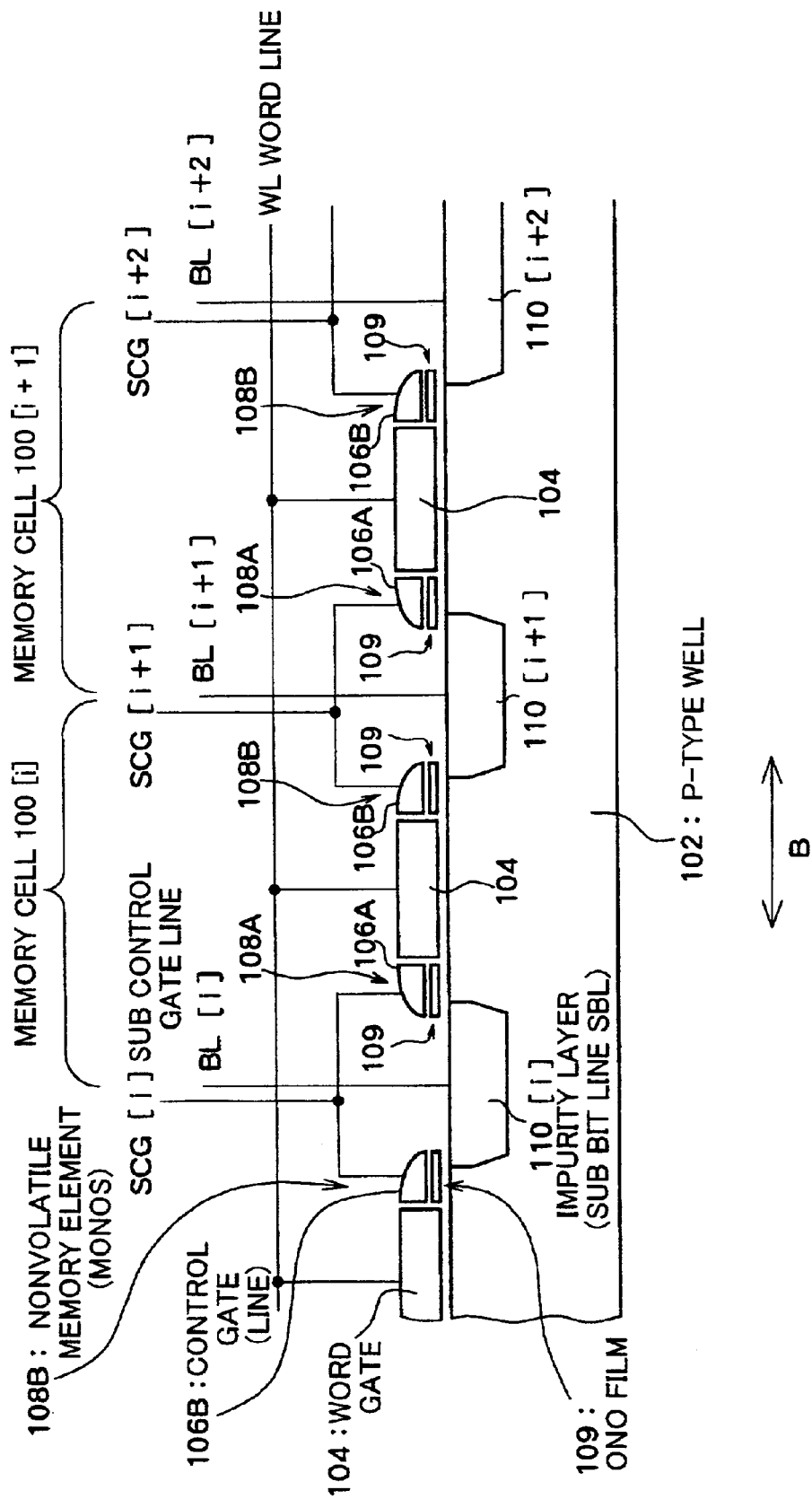
FIG. 1 is a sectional view of memory cells applied to a nonvolatile semiconductor storage device according to an embodiment of the present invention.

Now, an embodiment of the present invention will be described with reference to the drawing.

Memory Cell

FIG. 1 shows one section of a nonvolatile semiconductor storage device. Referring to the figure, a memory cell 100 includes a word gate 104 which is formed from a material containing, for example, polysilicon, over a P-type well 102 and through a gate oxide film, first and second control gates 106A and 106B, and first and second memory elements (MONOS memory elements) 108A and 108B.

The first and second control gates 106A, 106B are formed at both the sidewalls of the word gate 104, and they are electrically insulated from the word gate 104, respectively.

Each of the first and second memory elements 108A, 108B is constructed by stacking an oxide film (O), a nitride film (N) and an oxide film (O) between the corresponding one of the first and second control gates 106A, 106B, which are formed of the polysilicon corresponding to the M (metal) of "MONOS", and the P-type well 102. Incidentally, the first and second control gates 106A, 106B can also be made of a conductive material such as silicide.

In this manner, one memory cell 100 includes the first and second MONOS memory elements 108A, 108B having the split gates (first and second control gates 106A, 106B), and one word gate 104 is shared by the first and second MONOS memory elements 108A, 108B.

The first and second MONOS memory elements 108A, 108B function as charge trap sites, respectively. Each of the first and second MONOS memory elements 108A, 108B is capable of trapping electric charges by an ONO film 109.

As shown in FIG. 1, a plurality of word gates 104 which are arranged at intervals in a row direction (a second direction B in FIG. 1) are connected in common to one word line WL which is formed of a polycide or the like.

The control gates 106A, 106B shown in FIG. 1 extend in a first direction (a column direction A perpendicular to the sheet of FIG. 1), and they are shared by a plurality of memory cells 100 which are arranged in the column direction. Therefore, the parts 106A, 106B shall be also termed "control gate lines".

A sub control gate line SCG [i+1] which is formed of a metal layer overlying the word gate, control gates and word line by way of example is connected to the control gate line 106B of the [i]th memory cell 100 [i] and the control gate line 106A of the [i+1]th memory cell 100 [i+1].

The P-type well 102 is provided with an [i+1]th impurity layer 110 [i+1] which is shared by the MONOS memory element 108B of the [i]th memory cell 100 [i] and the MONOS memory element 108A of the [i+1]th memory cell 100 [i+1].

Each of such impurity layers 110 [i], [i+1] and [i+2] is, for example, an N-type impurity layer which is formed in the P-type well, which extends in the first direction (column direction A perpendicular to the sheet of FIG. 1), and which functions as a sub bit line shared by the plurality of memory cells 100 arranged in the column direction. Therefore, the parts 110 [i], [i+1] and [i+2] shall be also termed "sub bit lines SBL [i], [i+1] and [i+2]".

Overall Construction of Nonvolatile Semiconductor Storage Device

The general construction of the nonvolatile semiconductor storage device constructed using the above memory cells 100 will be described with reference to FIGS. 2A to 2E.

Figure 2:
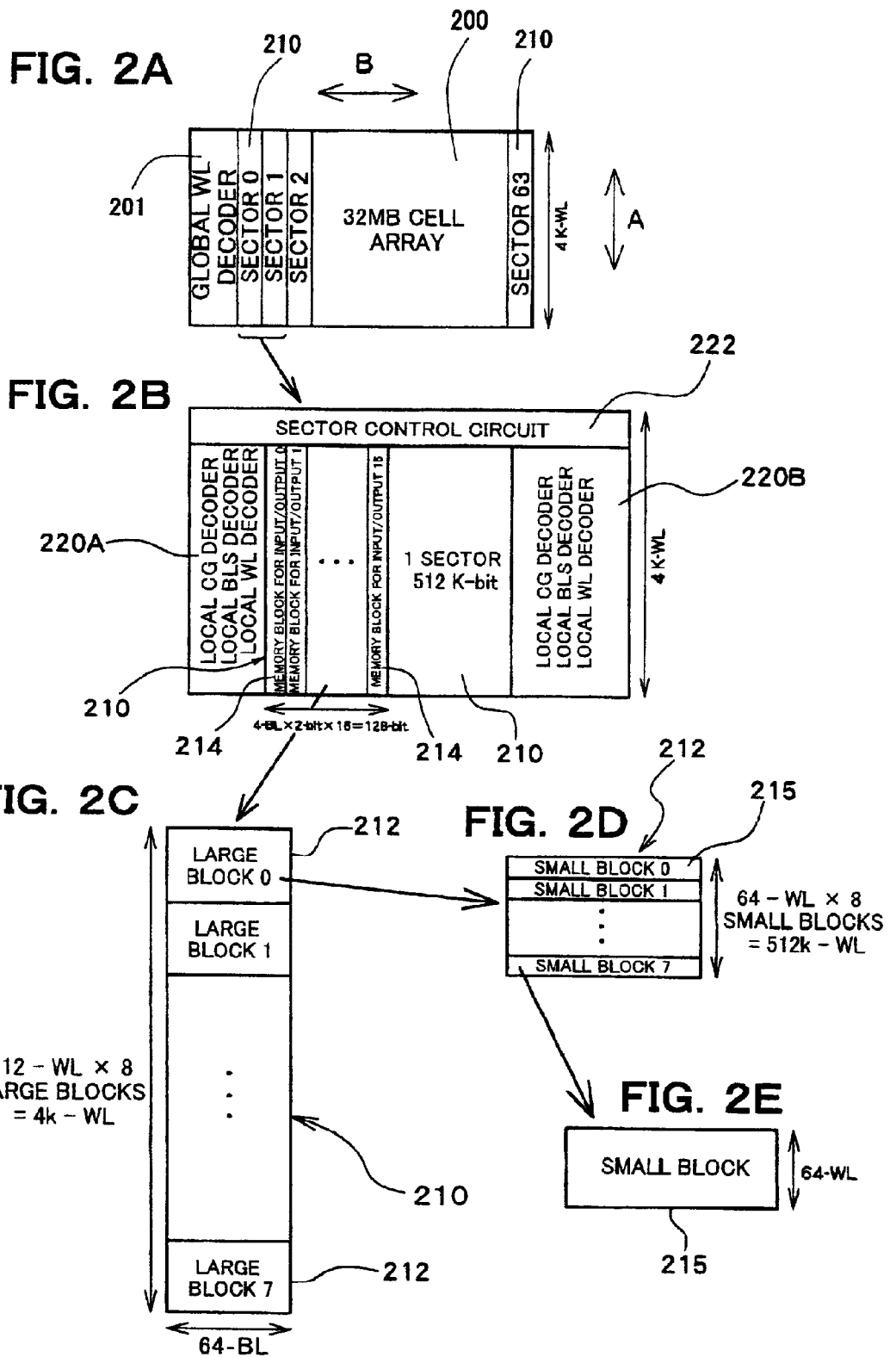
FIG. 2A is a plan view of an overall layout of the nonvolatile semiconductor storage device shown in FIG. 1.
FIG. 2B is a plan view of two sector areas in FIG. 2A.
FIG. 2C is a plan view of one memory block in FIG. 2B.
FIG. 2D is a plan view of one large block in FIG. 2C.
FIG. 2E is a plan view of one small block in FIG. 2D.

FIG. 2A is a plan layout view of the nonvolatile semiconductor storage device of single chip, which includes a memory cell array region 200 and a global word line decoder 201. The memory cell array region 200 includes, for example, 0th to 63rd sector areas 210 in the total number of 64.

As shown in FIG. 2A, the 64 sector areas 210 are obtained by dividing the memory cell array region 200 in the second direction (row direction) B, and each sector area 210 has a vertically longer shape whose longitudinal direction is the first direction (column direction). A minimum section for erasing data is each sector area 210, and data stored in the sector areas 210 are erased collectively or in time division.

The memory array area 200 has, for example, 4 k word lines WL and 4 k bit lines BL. Here in this embodiment, the two MONOS memory elements 108A, 108B are connected to one bit line BL, and hence, the 4 k bit lines BL signify a storage capacity of 8 kbits. The storage capacity of each sector area 210 is equal to 1/64 of the storage capacity of the whole memory, and the latter storage capacity is defined by (4 k word lines WL)×(64 bit lines BL)×2.

FIG. 2B shows the details of the two adjacent 0th and 1st sector areas 210 of the nonvolatile semiconductor storage device shown in FIG. 2A. As shown in FIG. 2B, local driver areas (each including a local control gate driver, a local bit line selection driver and a local word line driver) 220A and 220B are arranged on both the sides of the two sectors 210. Besides, a sector control circuit 222 is arranged on, for example, the upper sides of the two sectors 210 and the two local driver areas 220A, 220B.

Each sector area 210 is divided in the row direction, into 16 memory blocks (memory blocks corresponding to input/output bits) 214 for I/O 0 to I/O 15 so that data of 16 bits can be read and written. As shown in FIG. 2B, each memory block 214 has 4 k (4096) word lines WL.

As shown in FIG. 2C, each sector area 210 shown in FIG. 2B is divided into eight large blocks 212 in the column direction A. As shown in FIG. 2D, each large block 212 is divided into eight small blocks 215 in the column direction A.

Each small block 215 has 64 word lines WL as shown in FIG. 2E.

Details of Sector Area

Figure 3:
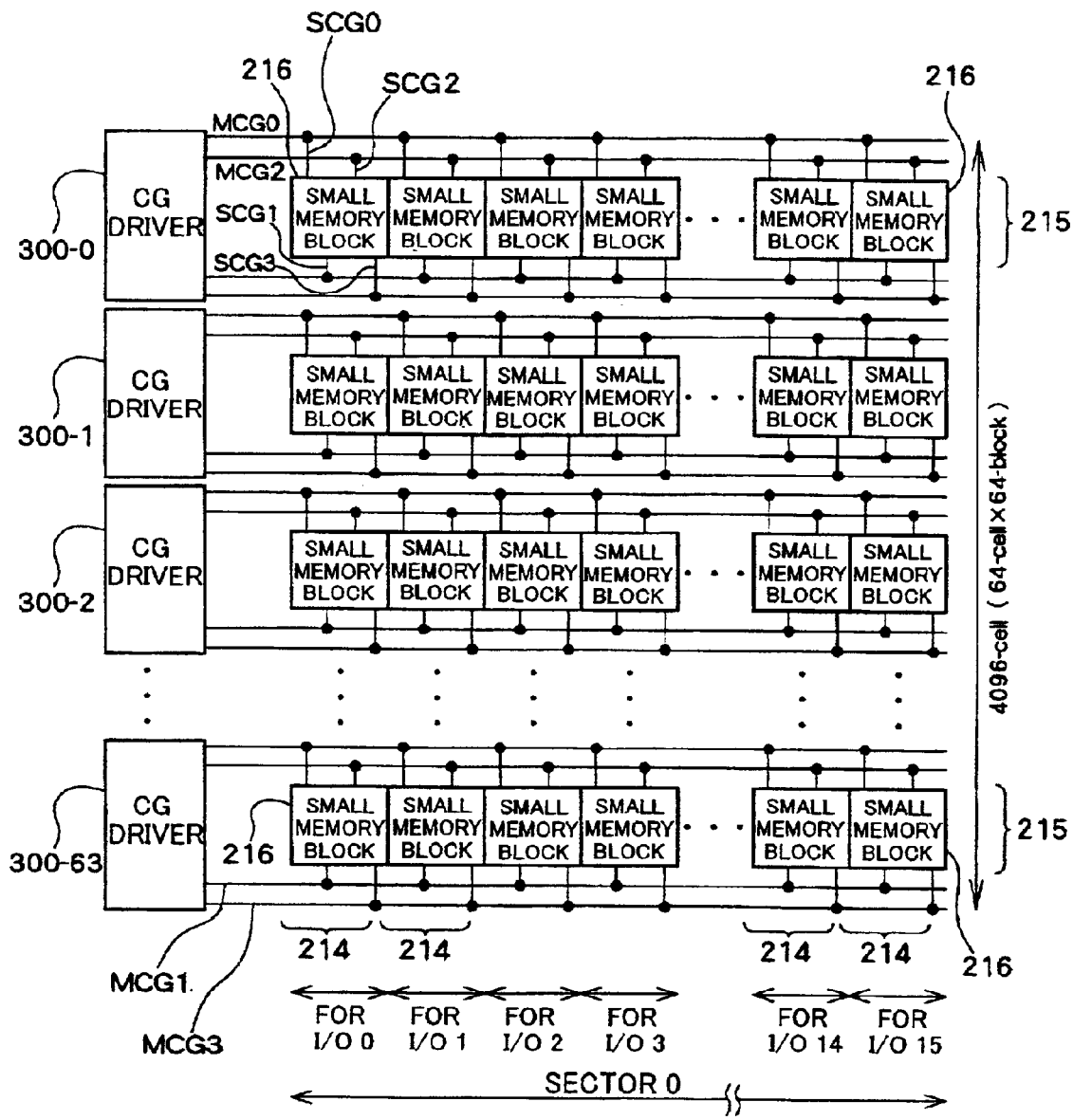
FIG. 3 is a schematic diagram explaining the large number of small memory blocks of one sector area shown in FIG. 2B and the wiring lines thereof.
Figure 4:
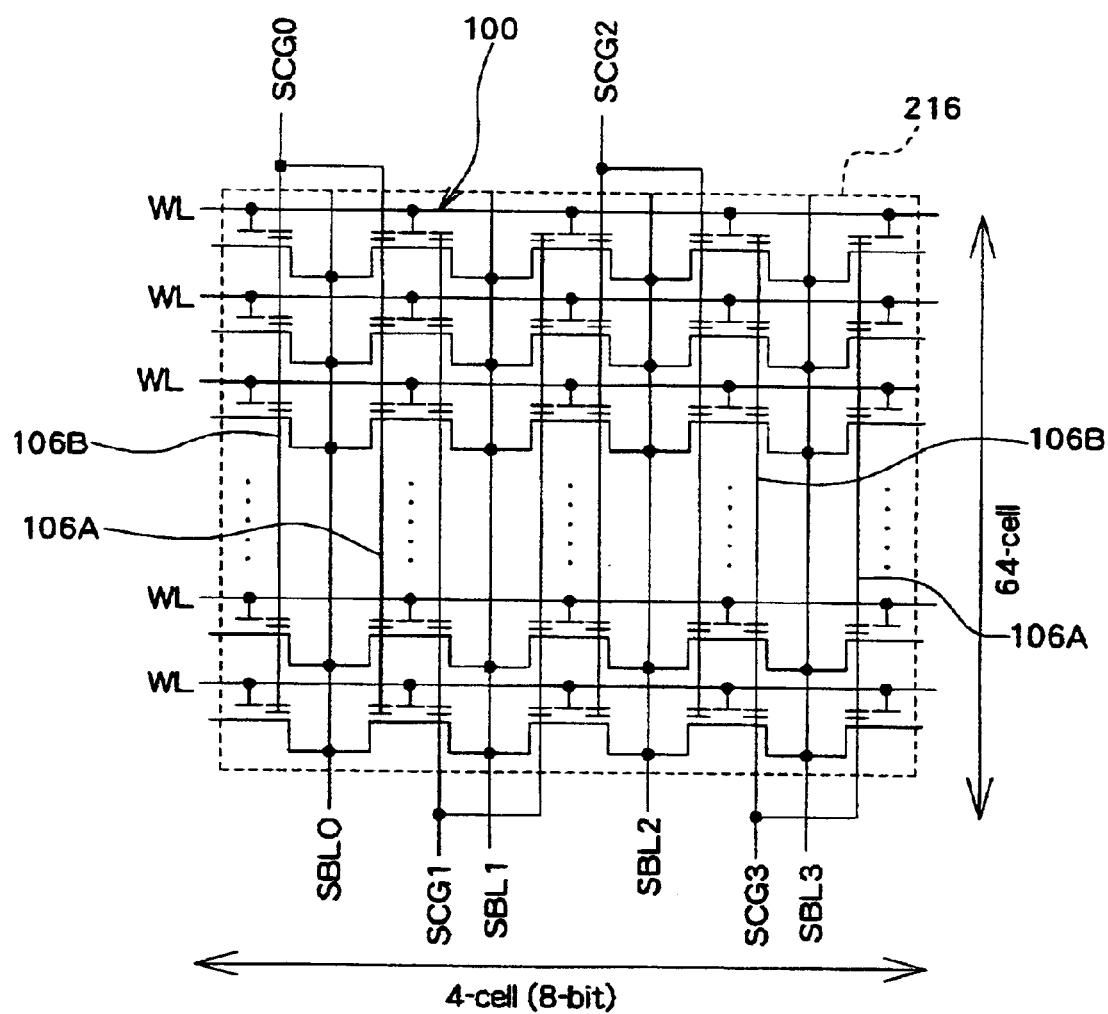
FIG. 4 is a circuit diagram of the small memory block shown in FIG. 3.

FIG. 3 shows the details of the sector area 0 shown in FIG. 2A. A small memory block 216 shown in FIG. 3 is constructed by arranging the memory cells 100 in the number of, for example, 64 in the column direction and in the number of, for example, 4 in the row direction as shown in FIG. 4. By way of example, four sub control gate lines SCG 0 to SCG 3, four sub bit lines SBL 0 to SBL 3 being data input/output lines, and 64 word lines WL are connected to one small memory block 216.

Here, the second control gates 106B of the respective memory cells of the even-numbered column (0th column or second column), and the first control gates 106A of the respective memory cells of the odd-numbered column (first column or third column) are connected in common to the even-numbered sub control gate line SCG 0 or SCG 2. Likewise, the second control gates 106B of the respective memory cells of the odd-numbered column (first column or third column), and the first control gates 106A of the respective memory cells of the even-numbered column (second column or fourth column) are connected in common to the odd-numbered sub control gate line SCG 1 or SCG 3.

As shown in FIG. 3, the small memory blocks 216 are arranged in the number of 64 in the column direction (each column forms the small block 215) within one memory block 214, and the 16 memory blocks 214 corresponding to the 16 inputs/outputs, I/O 0 to I/O 15 are arranged in the row direction in order to input/output 16 bits.

The 16 sub control gate lines SCG 0 of the 16 small memory blocks 216 arranged in the row direction are connected in common to a main control gate line MCG 0 laid in the row direction. Likewise, the 16 sub control gate lines SCG 1 are connected in common to a main control gate line MCG 1, the 16 sub control gate lines SCG 2 to a main control gate line MCG 2, and the 16 sub control gate lines SCG 3 to a main control gate line MCG 3.

The corresponding one of CG drivers 300-0 through 300-63 constituting a control gate drive section is disposed in each small block 215 within the sector area 0. The four main control gate lines MCG 0 to MCG 3 extending in the row direction are connected to each of the CG drivers 300-0 through 300-63.

Figure 5:
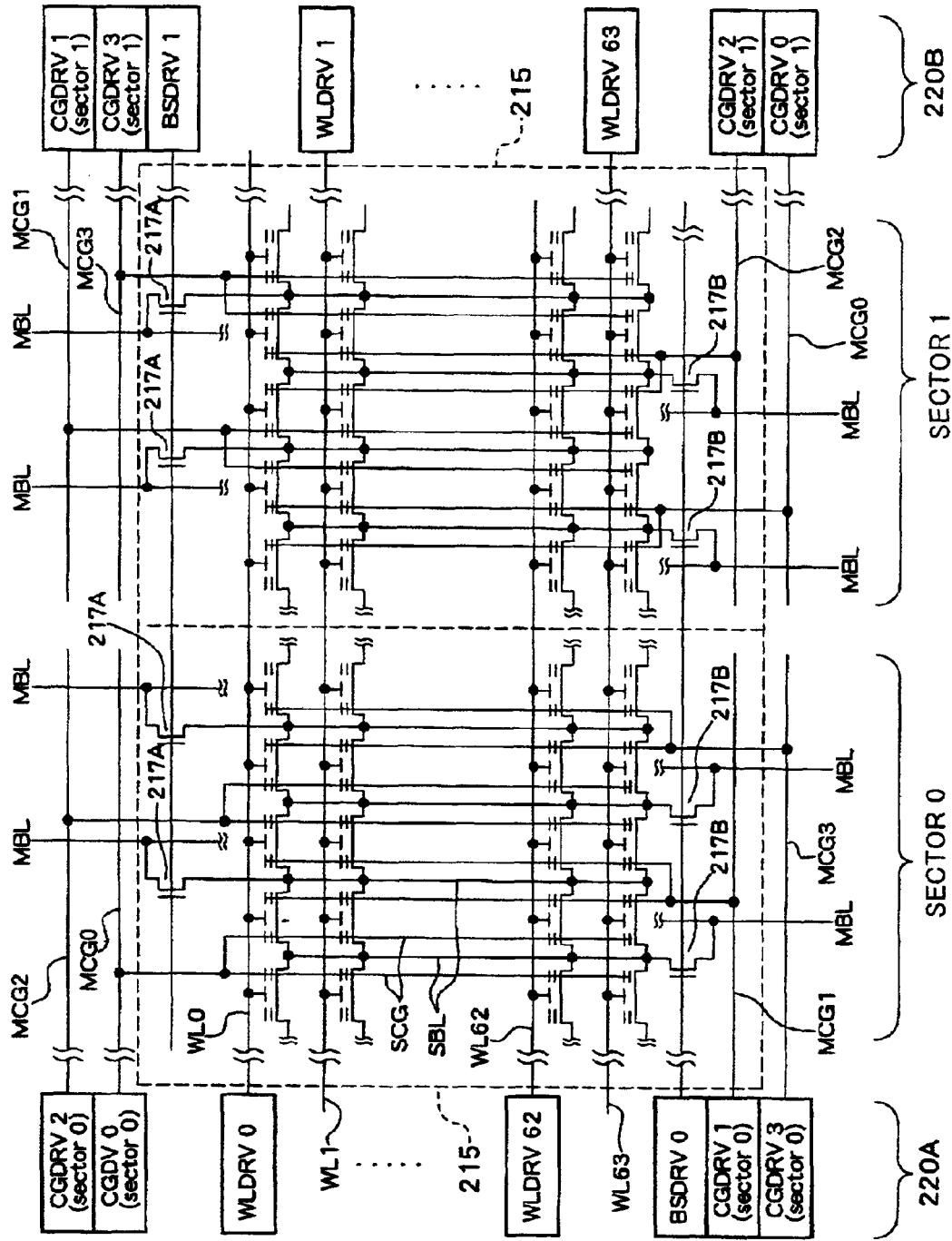
FIG. 5 is a diagram showing the relationship between small blocks and local driver areas shown in FIG. 3.

FIG. 5 shows the relationship between the two small blocks 215 which belong to the sector areas 0 and 1 adjacent to each other, respectively. In the sector areas 0 and 1, the 64 word lines WL 0 to WL 63 are shared, but the main control gate lines MCG 0 to MCG 3 and main bit lines MBL are laid independently of each other. Particularly in FIG. 5, CG drivers CGDRV 0 to 3 corresponding to the small block 215 in the sector area 0, and CG drivers CGDRV 0 to 3 corresponding to the small block 215 in the sector area 1 are shown, and the CG drivers are disposed independently for the respective small blocks 215.

All the sub bit lines SBL 0 (impurity layers) arranged every small block 215 are connected in common to the main bit line MBL which is a metal wiring line. The main bit line MBL is shared among the small memory blocks 216 which are arranged in the first direction (column direction A). Bit line selection gates 217A or 217B which are bit line selection switching elements are arranged midway of respective paths which lead from the main bit line MBL to the corresponding sub bit lines SBL 0 in the small memory blocks 216. By way of example, the bit line selection gates 217A are respectively connected to the odd-numbered sub bit lines SBL, whereas the bit line selection gates 217B are respectively connected to the even-numbered sub bit lines SBL.

Figure 6:
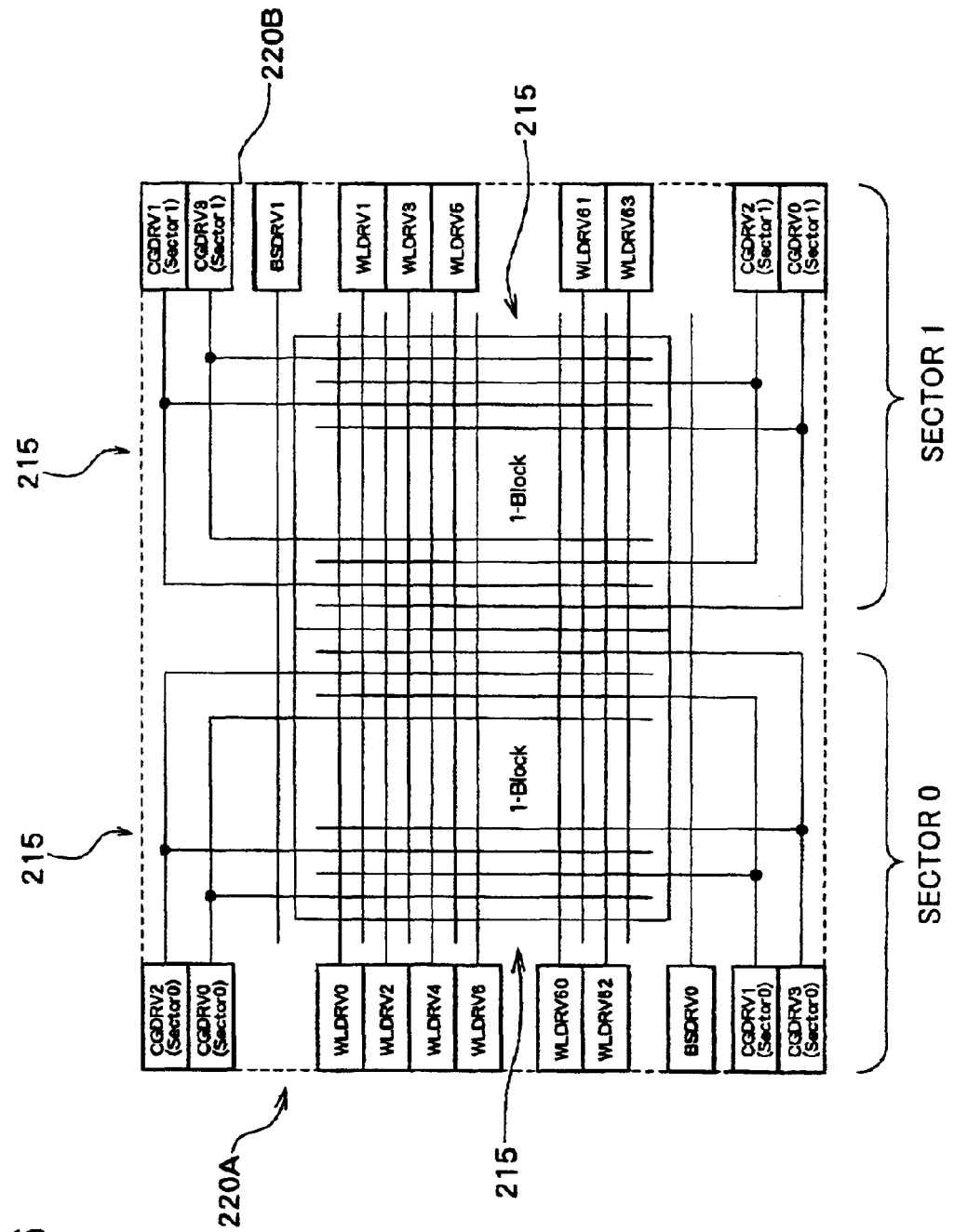
FIG. 6 is a schematic diagram explaining the relationship between the two small blocks in two adjacent sectors and the local driver areas.

The two small blocks 215 in the two, 0th and first sector areas 210 adjacent to each other, and the local driver areas 220A, 220B on both the sides thereof are shown in detail in FIG. 6. As shown in FIG. 6, the four local control gate line drivers CGDRV 0 to CGDRV 3 shown in FIG. 5 are arranged in the left local driver area 220A. Likewise, the four local control gate line drivers CGDRV 0 to CGDRV 3 shown in FIG. 5 are arranged in the right local driver area 220B.

Besides, local word line drivers WLDRV 0, . . . , WLDRV 62 which drive the even-numbered word lines WL 0, 2, . . . , 62 in the sectors 0, 1, respectively, are arranged in the left local driver area 220A. Local word line drivers WLDRV 1, . . . , WLDRV 63 which drive the odd-numbered word lines WL 1, 3, . . . , 63 in the sectors 0, 1, respectively, are arranged in the right local driver area 220B.

Further, as shown in FIGS. 5 and 6, a local bit line driver BSDRV 1 which drives the bit line selection gates 217A connected to, for example, the odd-numbered sub bit lines SBL of the sectors 0, 1 is arranged in the right local driver area 220B. A local bit line driver BSDRV 0 which drives the bit line selection gates 217B connected to, for example, the even-numbered sub bit lines SBL of the sectors 0, 1 is arranged in the left local driver area 220A.

Drive Circuits of Sectors 0 and 1

Figure 7:
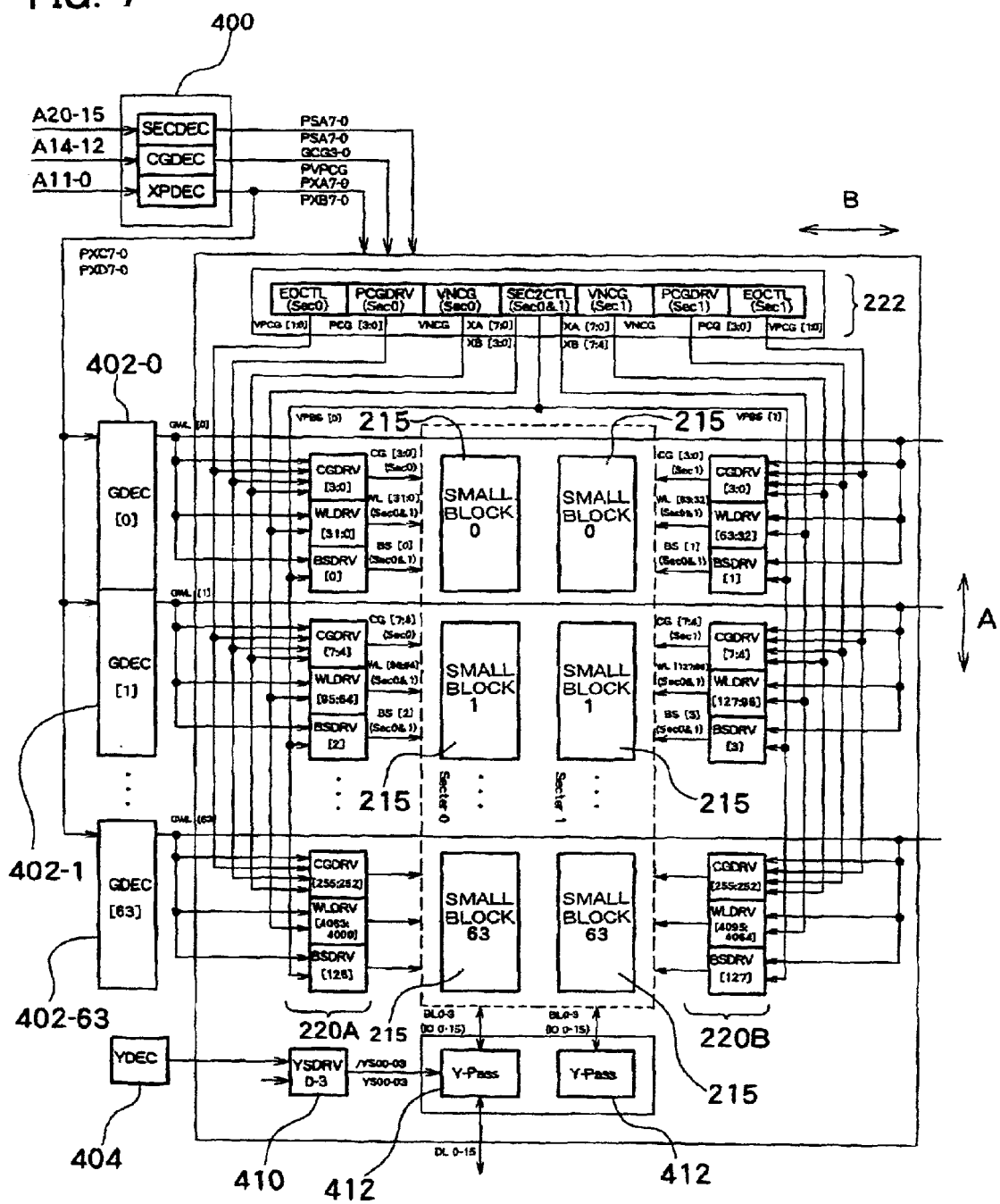
FIG. 7 is a block diagram showing the peripheral drive circuits of the two adjacent sectors.

Next, circuits which drive the memory cells in the respective small blocks 215 within the sectors 0, 1 will be described with reference to FIG. 7.

First, a predecoder 400, 64 global decoders 402-0 through 402-63, and a Y-decoder 404 are disposed as constituents which are shared by the sectors 0 to 63.

The predecoder 400 decodes an address signal A [20-0] which specifies a nonvolatile memory element to-be-selected (selected cell). The significances of the address signal A [20-0] will be indicated in Table 1 below.

TABLE 1

| ADDRESS | GROUP | FUNCTION | |
|---|---|---|---|
| A [20–15] | Sector | Choose 1 of 64 | |
| A [14–12] | Row | Choose 1 of 8 | |
| A [11–9] | Large block | Choose 1 of 8 | Choose 1 of 4096 |
| A [8–6] | Small block | Choose 1 of 8 | |
| A [5–0] | Column | Choose 1 of 64 | |

As indicated in Table 1, one of the 64 sectors is selected by the higher-order address signal A [20-15], one bit in four cells (8 bits) within one small memory block 216 shown in FIG. 4 is selected by the medium-order address signal A [14-12], and one of the 4096 word lines WL in one sector is selected by the lower-order address signal A [11-0]. More specifically, one of the eight large blocks 212 existing in one sector is selected by the address signal A [11-9], one of the eight small blocks 215 existing in one large block 212 is selected by the address signal A [8-6], and one of the 64 word lines WL existing in one small block 215 is selected by the address signal A [5-0].

The 64 global decoders 402-0 through 402-63 render 64 global word lines GWL [0] to GWL [63] active on the basis of a result obtained by predecoding the lower-order address signal A [11-0] by means of the predecoder 400. Incidentally, only one global word line GWL is rendered active (Vdd) in each of a data read mode and a data program mode. All the 64 global word lines GWL are rendered active (Vdd) in a data erase mode in a case where data in one sector are collectively erased. For this reason, all the word lines WL in one sector are selected and are fed with a word line voltage for erasing.

The Y-decoder 404 drives a Y-pass circuit 412 through a Y-pass selection driver 410, whereby the selected bit line in the small block 215 is connected to a sense amplifier or a bit line driver at a succeeding stage.

As already described with reference to FIGS. 5 and 6, the local driver areas 220A, 220B are disposed on both the sides of the small blocks 215 in FIG. 7.

Let's take as an example the small memory blocks 0 at the first row in the sectors 0, 1. In the local driver area 220A on the left side of these blocks 0, there are arranged a control gate line driver CGDRV [3-0] which drives the four main control gate lines MCG in the sector 0, a word line driver WLDRV [31-0] which drives the 31 even-numbered word lines WL in the sectors 0, 1, and a bit line selection driver BSDRV [0] which drives the bit line selection transistors 217B connected to the even-numbered sub bit lines SBL in the sectors 0, 1. In the local driver area 220B on the right side, there are arranged a control gate line driver CGDRV [3-0] which drives the four main control gate lines MCG in the sector 1, a word line driver WLDRV [63-32] which drives the 31 odd-numbered word lines WL in the sectors 0, 1, and a bit line selection driver BSDRV [1] which drives the bit line selection transistors 217A connected to the odd-numbered sub bit lines SBL in the sectors 0, 1.

Next, the sector control circuit 222 arranged, for example, on the upper sides of the sectors 0, 1 will be described in detail with reference to FIG. 7.

Two control-gate-voltage control circuits EOCTL which are disposed in correspondence with the sectors 0, 1, respectively, output two sorts of high voltages VPCG [1:0] for the control gates, each of which is set at either potential VP1 or VP2, on the basis of a predecoded output from the predecoder 400. That is, when one high voltage VPCG [0] for the control gates is the potential VP1, the other high voltage VPCG [1] for the control gates becomes the potential VP2.

Here, the voltages VP1, VP2 are generated by booster circuits (charge pumps) not shown, and they are set at boosted voltages which differ depending upon the modes. By way of example, VP1=1.5V and VP2=3V hold in the data read mode. On the other hand, VP1=5.5V and VP2=2.5V hold in the data program mode.

Figure 8:
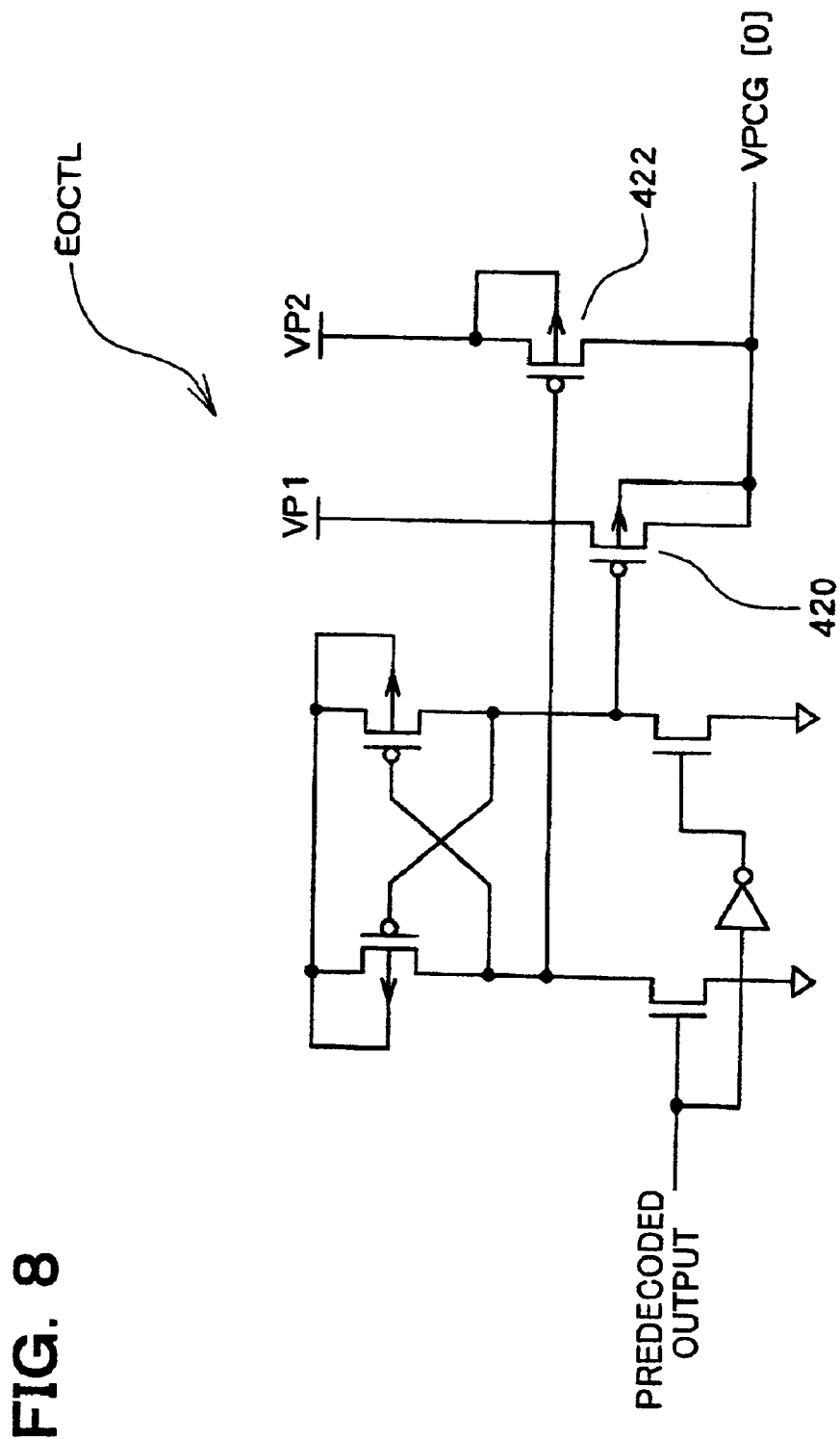
FIG. 8 is a circuit diagram showing an example of a control-gate-voltage control circuit EOCTL shown in FIG. 7.

FIG. 8 shows an example of a circuit which outputs the high voltage VPCG [0] for the control gates, in the control-gate-voltage control circuit EOCTL. Referring to FIG. 8, when the predecoded output is HIGH, a P-type MOS transistor 420 turns OFF, and a P-type MOS transistor 422 turns ON, so that the voltage VP2 is outputted as the high voltage VPCG [0] for the control gates. To the contrary, when the predecoded output is LOW, the P-type MOS transistor 420 turns ON, and the P-type MOS transistor 422 turns OFF, so that the voltage VP1 is outputted as the high voltage VPCG [0] for the control gates.

Two precontrol gate line drivers PCGDRV which are disposed in correspondence with the sectors 0, 1, respectively, output driver selection signals PCG [3:0] each of which renders active any of the four control gate line drivers CGDRV 0 to 3 disposed in correspondence with the small blocks 215 in the corresponding sector 0 or 1, on the basis of the predecoded output from the predecoder 400.

Figure 9:
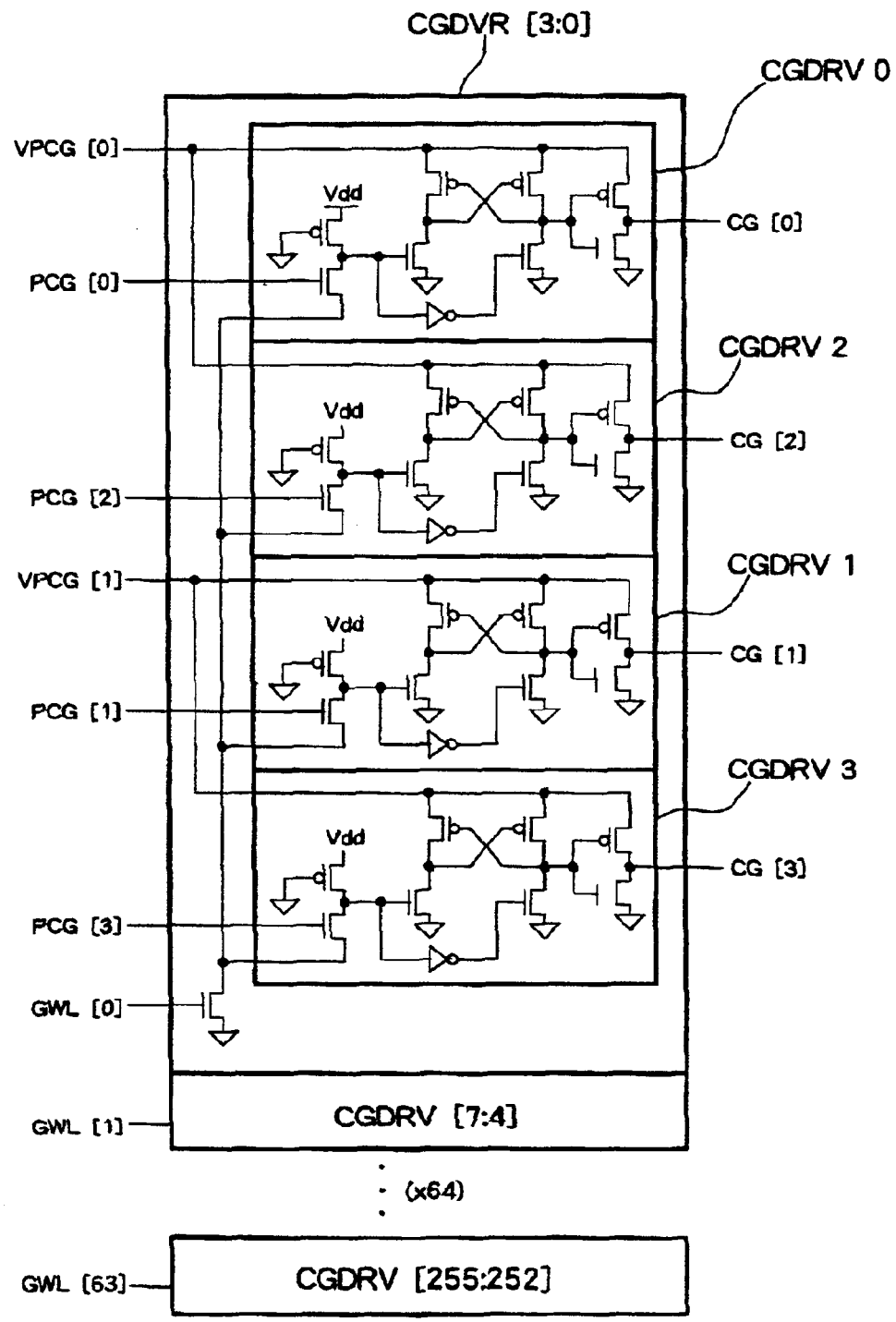
FIG. 9 is a circuit diagram showing an example of a control gate line driver CGDRV shown in FIG. 7.

Here, control gate line drivers CGDRV [3:0] to CGDRV [255:252] disposed in correspondence with the small blocks 0 to 63 in the sector 0 are shown in FIG. 9.

Referring to FIG. 9, the high voltage VPCG [0] for the control gates are inputted to the control gate line drivers CGDRV 0, 2, while the high voltage VPCG [1] for the control gates are inputted to the control gate line drivers CGDRV 1, 3.

Besides, driver selection signals PCG [3:0] are respectively inputted to the corresponding control gate line drivers CGDRV 0 to 3.

In the case of the control gate line driver CGDRV 0 as an example, the high voltage VPCG [0] for the control gates, being the voltage VP1 or VP2, is outputted from the control gate line driver CGDRV 0, only in a case where the global word line signal GWL [0] is HIGH and the driver selection signal PCG [0] is HIGH. In any other case, the output of the control gate line driver CGDRV 0 becomes 0V. This operation is also true of the other control gate line drivers.

Two negative voltage supply circuits VNCG for precontrol gates as are disposed in correspondence with the sectors 0, 1, respectively, feed a negative voltage VNCG (for example, −3V) to be applied to the control gates in the data erase mode, to the four control gate line drivers CGDRV 0 to 3 disposed in correspondence with the small blocks 215 in the corresponding sector 0 or 1, on the basis of the predecoded output from the predecoder 400.

Although a circuit which feeds the negative voltage VNCG in the data erase mode is omitted from FIG. 9, it feeds the negative voltage VNCG to the control gates in all the small blocks 215 within the corresponding sector in the data erase mode, whereby data can be collectively erased every sector.

A 2-sector control circuit SEC2CTL which is disposed in common for the sectors 0, 1, outputs signals XA [7:0], XB [3:0] and XB [7:4] for selecting the word line drivers WLDRV disposed in correspondence with the respective small blocks 215 within the sectors 0, 1, and further outputs a voltage VPBS [1:0] for driving the bit line selection drivers BSDRV.

Here, the "signal XA [7:0] for selecting the word line drivers" corresponds to the address signal A [2:0], and it selects by a signal of 8 bits, one word line driver WLDRV in those pair of small blocks 215 of the sectors 0, 1 by which the word line is shared. On the other hand, the "selection signal XB [7:0]" corresponds to the address signal A [5:3]. In this regard, eight word line drivers WLDRV connected to each even-numbered word line WL are selected from among the 64 word line drivers WLDRV [63-0] corresponding to one small block 215, by the selection signal XB [3:0] of 4 bits. Also, eight word line drivers WLDRV connected to each odd-numbered word line WL are selected from among the 64 word line drivers WLDRV [63-0] corresponding to one small block 215, by the other selection signal XB [7:4] of 4 bits.

Figure 10:
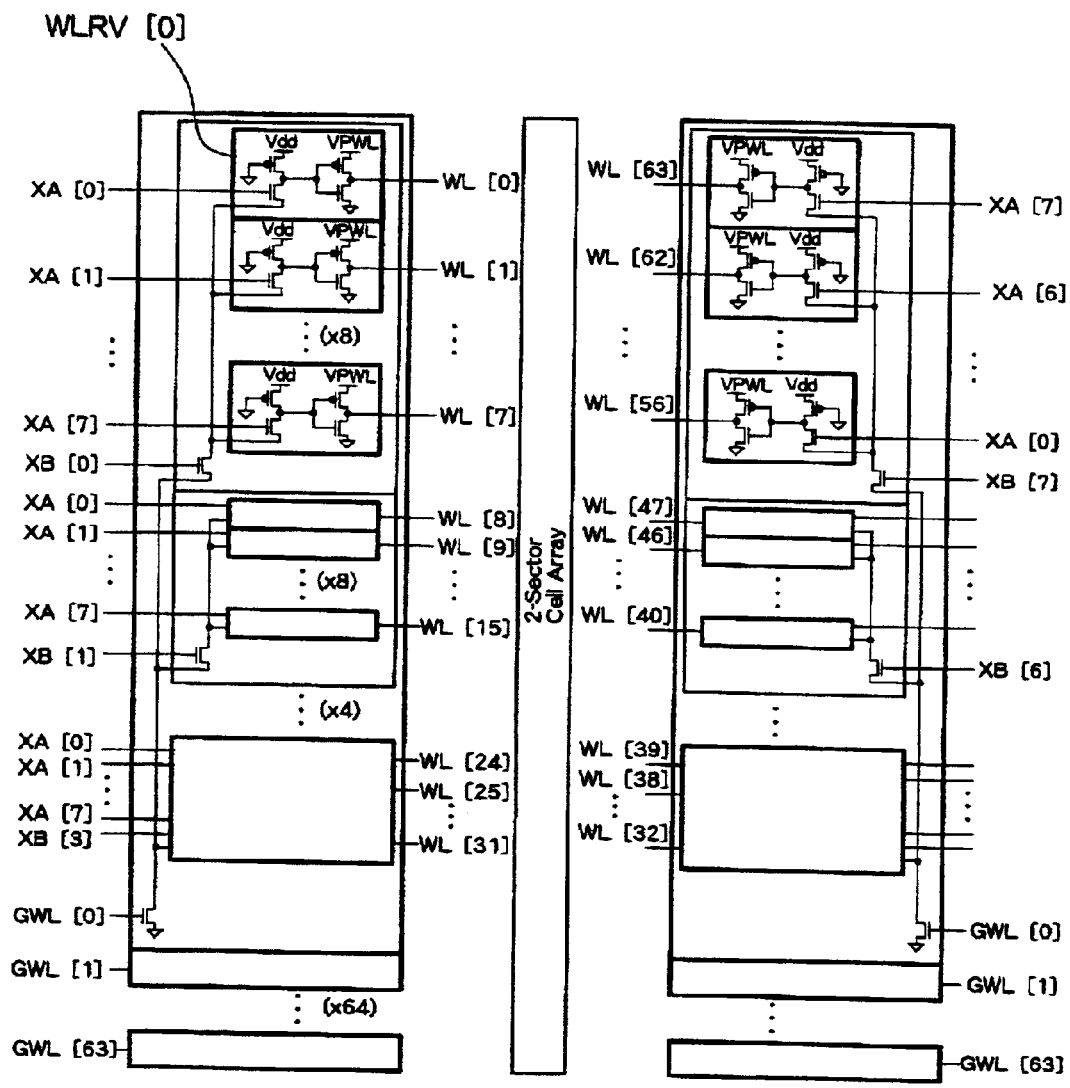
FIG. 10 is a circuit diagram showing an example of a word line driver WLDRV shown in FIG. 7.

In the case of the word line driver WLDRV [0] shown in FIG. 10, it feeds a potential VPWL to the word line WL [0] when all the signals GWL [0], XA [0] and XB [0] have become active, and it feeds a ground potential at any other time. The potential VPWL becomes a write potential in writing data, and becomes a read potential in reading data.

Next, there will be explained the bit line selecting high voltage VPBS [1:0] which is outputted from the 2-sector control circuit SEC2CTL.

Figure 11:
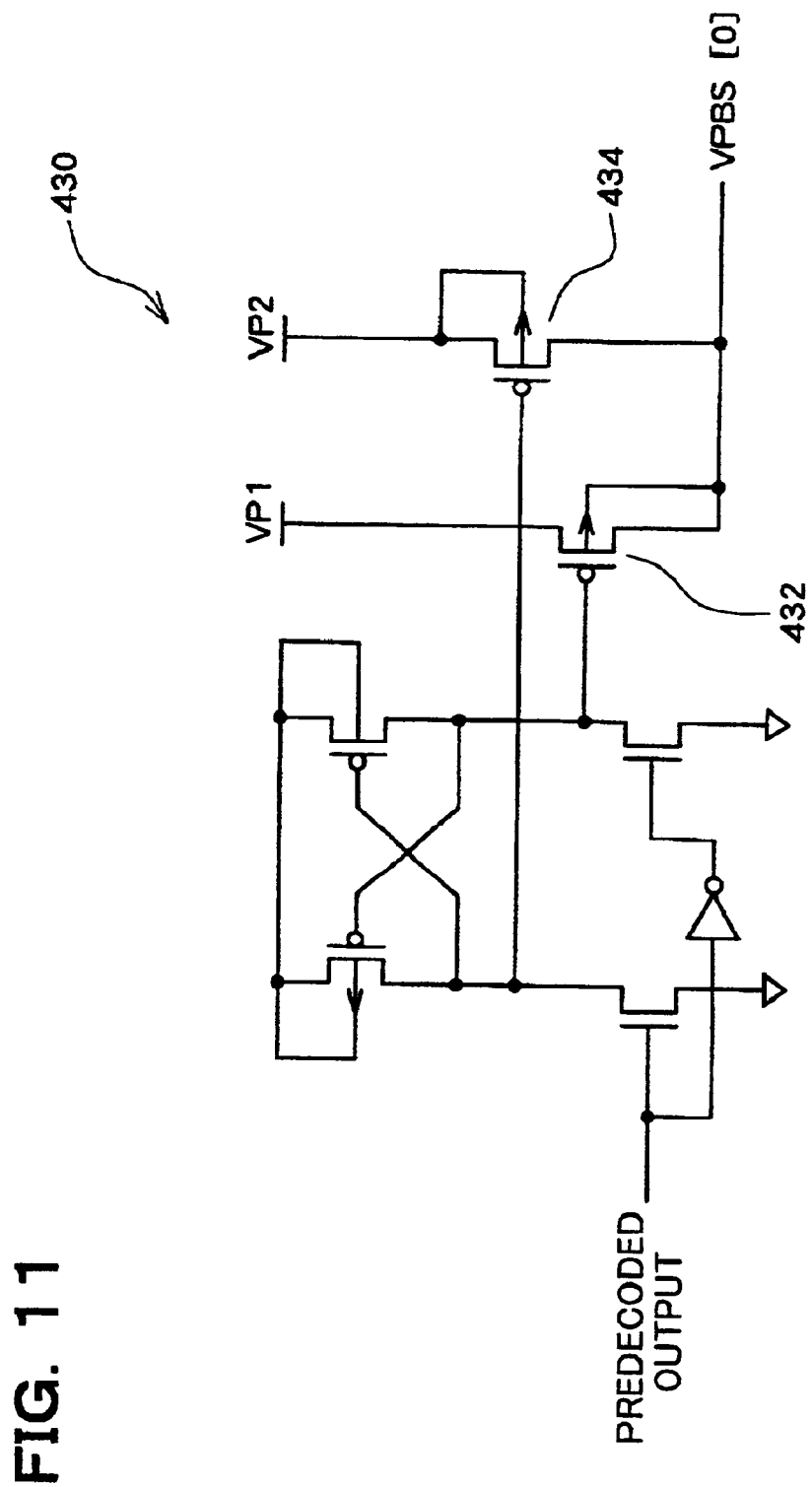
FIG. 11 is a circuit diagram showing an example of a bit-line-selection-voltage control circuit 430 which is included in a 2-sector control circuit SEC2CTL shown in FIG. 7.

As shown in FIG. 11, the 2-sector control circuit SEC2CTL includes a bit-line-selection voltage control circuit 430 which is constructed similarly to the control-gate-voltage control circuit EOCTL shown in FIG. 8.

FIG. 11 shows an example of the bit-line-selection voltage control circuit 430 which outputs the bit line selecting high voltage VPBS [0]. Referring to FIG. 11, when the predecoded output is HIGH, a P-type MOS transistor 432 turns OFF, and a P-type MOS transistor 434 turns ON, so that the voltage VP2 is outputted as the bit line selecting high voltage VPBS [0]. To the contrary, when the predecoded output is LOW, the P-type MOS transistor 432 turns ON, and the P-type MOS transistor 434 turns OFF, so that the voltage VP1 is outputted as the bit line selecting high voltage VPBS [0].

These voltages VP1, VP2 are also generated in correspondence with the respective modes by the booster circuits stated before. More specifically, VP1=Vdd (1.5V) and VP2= 4.5V, for example, hold in the data read mode, and VP1= VP2=8V, for example, holds in the data program mode and the data erase mode.

Figure 12:
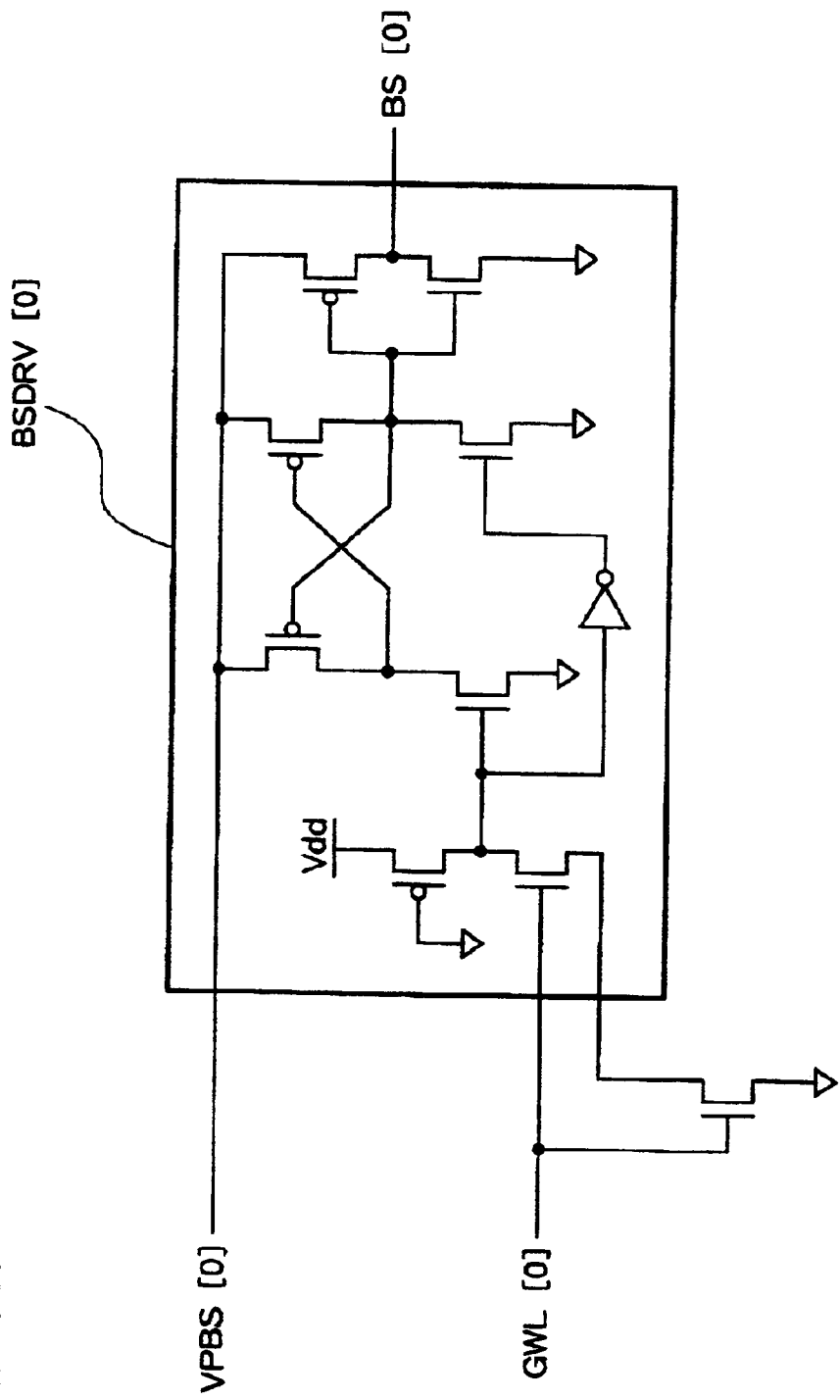
FIG. 12 is a circuit diagram showing an example of a bit line driver BSDRV [0] shown in FIG. 7.

Here, the bit line selection driver BSDRV [0] disposed in correspondence with the small block 0 in the sector 0 is shown in FIG. 12.

Referring to FIG. 12, the bit line selecting high voltage VPBS [0] and the global word line signal GWL [0] are inputted to the bit line selection driver BSDRV [0]. On condition that the global word line signal GWL [0] is HIGH, the bit line selecting high voltage VPBS [0] of the voltage VP1 or VP2 is outputted from the bit line selection driver BSDRV [0]. In any other case, the output of the bit line selection driver BSDRV [0] becomes 0V. This operation is also true of the other bit line selection drivers.

Description of Operations

Here will be described the operations of reading data, programming data and erasing data in the nonvolatile semiconductor storage device of this embodiment.

Figure 13:
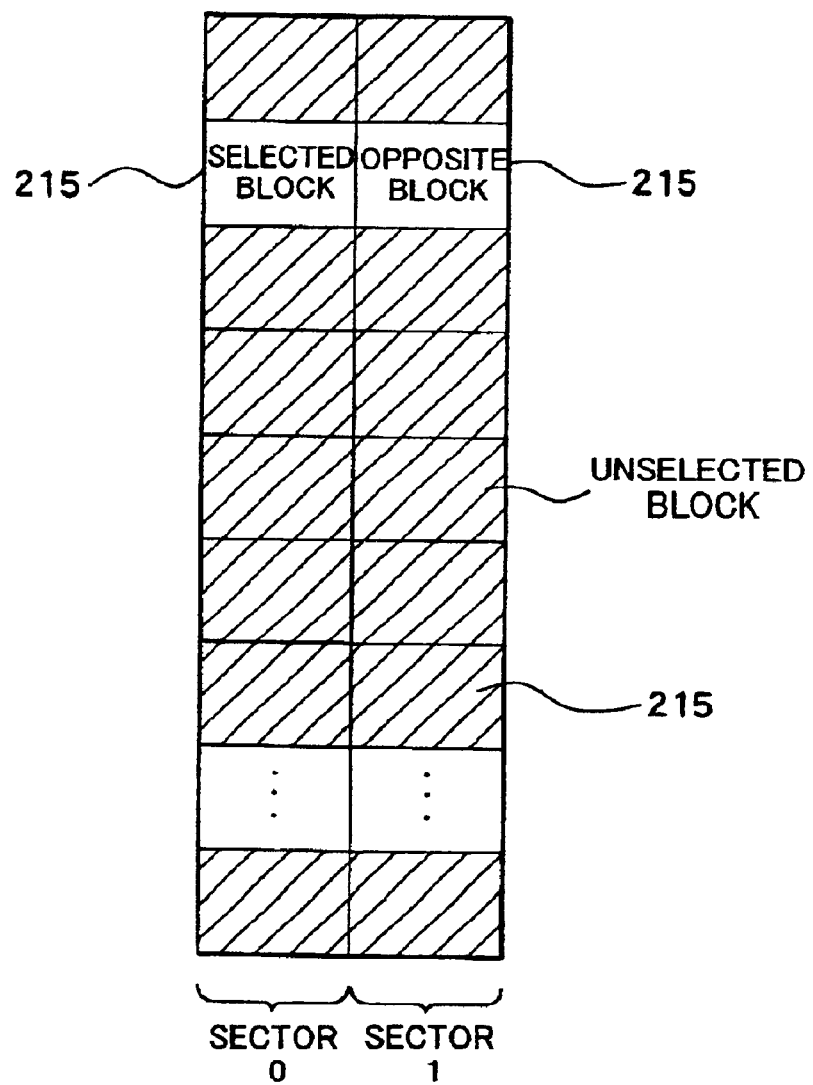
FIG. 13 is a schematic diagram explaining a selected block, an unselected opposite block opposing to the selected block, and the other unselected blocks.

In the ensuing description, there shall be used terms "selected block", "unselected opposite block" and "unselected block", which are the sorts of the names of the small blocks 215. Let's take as an example, one pair of sectors 0, 1 as shown in FIG. 13. The "selected block" signifies one small block 215 selected in the sector 0 by way of example. The "unselected opposite block" signifies that small block 215 in the sector 1 adjacent to the sector 0 which is adjacent to the selected block. The "unselected block" signifies any small block 215 other than the selected block and the opposite block in the sectors 0, 1 (and in the sectors 2 to 63).

Besides, the selected block in the read mode or the program mode includes therein a selected memory cell 100, and unselected memory cells 100. Further, the selected memory cell includes therein the memory element 108A or 108B of a selected cell, and the memory element 108B or 108A of an opposite cell.

Under the definitions given above, the potentials of the control gate line CG, bit line BL and word line WL in the read mode, program mode and erase mode will be indicated Table 2 and Table 3 below.

TABLE 2

| | | | Selected Block | | | | Unselected Twin | | |
|---|---|---|---|---|---|---|---|---|---|
| | | | Selected Twin MONOS Cell | | | | MONOS Cell | | |
| | | | Selected Cell | | Opposited Cell | | | | |
| Mode | BS | WL | BL | CG | BL | CG | WL | BL | CG |
| Read | 4.5 V (Opp. Side) Vdd (Sel. Side) | Vdd | 0 V | 1.5 V ± 0.1 V | sense | 3 V | Vdd or 0 V | sense or 0 V | 3 v or 1.5 V ± 0.1 V or 0 V |
| Program | 8 V | Approx. 1 V | 5 V | 5.5 V | Iprg = 5 uA (0 to 1 V) | 2.5 V | approx. 1 V or 0 V | 5 V or Vdd or (0 to 1 V) | 5.5 V or 2.5 V or 0 V |
| Erase | 8 V | 0 V | 4.5 to 5 V | −1 to −3 V | 4.5 to 5 V | −1 to −3 V | | | |

TABLE 3

| Mode | Opposite Block | | | | Unselected Block | | | |
| --- | --- | --- | --- | --- | --- | --- | --- | --- |
| | BS | WL | BL | CG | BS | WL | BL | CG |
| Read | 4.5 V (Opp. Side) Vdd (Sel. Side) | Vdd or 0 V | 0 V | 0 V | 0 V | 0 V | F | 0 V |
| Program | 8 V | Approx. 1 V or 0 V | 0 V | 0 V | 0 V | 0 V | F | 0 V |
| Erase | 8 V | 0 V | 0 V | 0 V | 0 V | 0 V | F | 0 V |

Now, the operations of the respective modes will be described in conjunction with Table 2 and Table 3.

Data Readout from Memory cell

Figure 14:
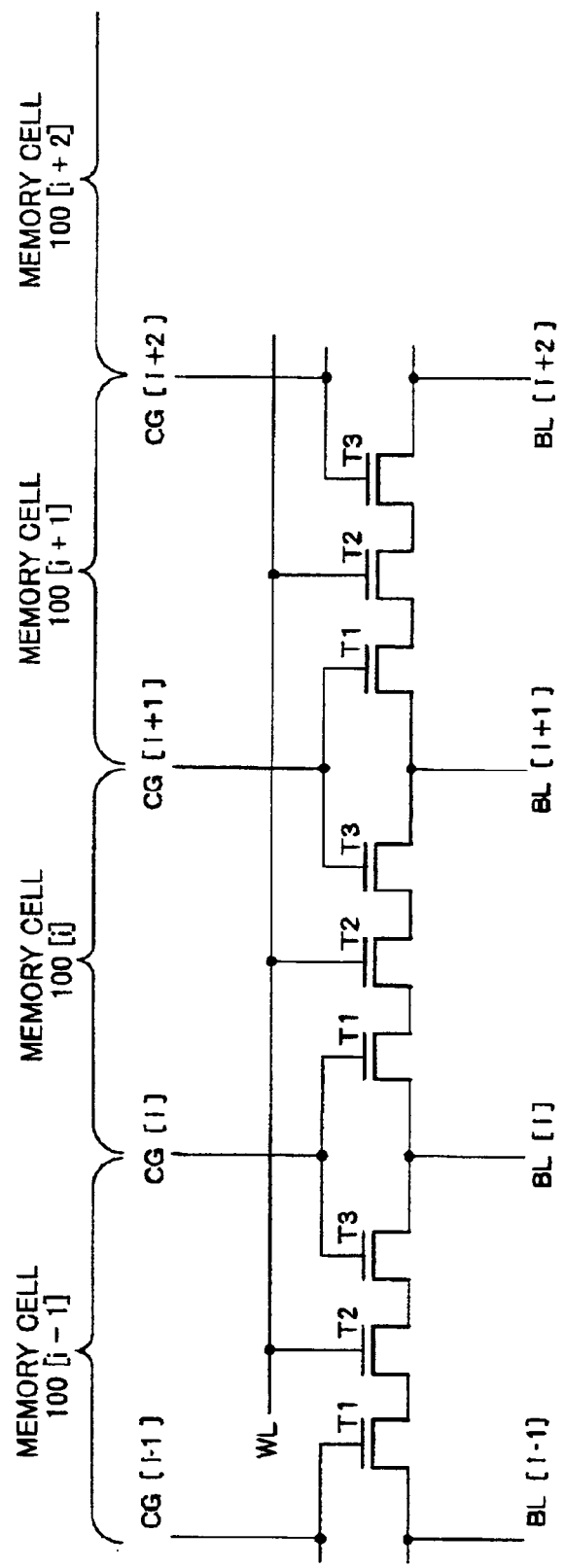
FIG. 14 is an equivalent circuit diagram of the memory cells shown in FIG. 1.

As shown in FIG. 14, one memory cell 100 can be modeled as a series connection consisting of a transistor T2 which is driven by the word gate 104, and transistors T1, T3 which are respectively driven by the first and second control gates 106A, 106B.

Figure 15:
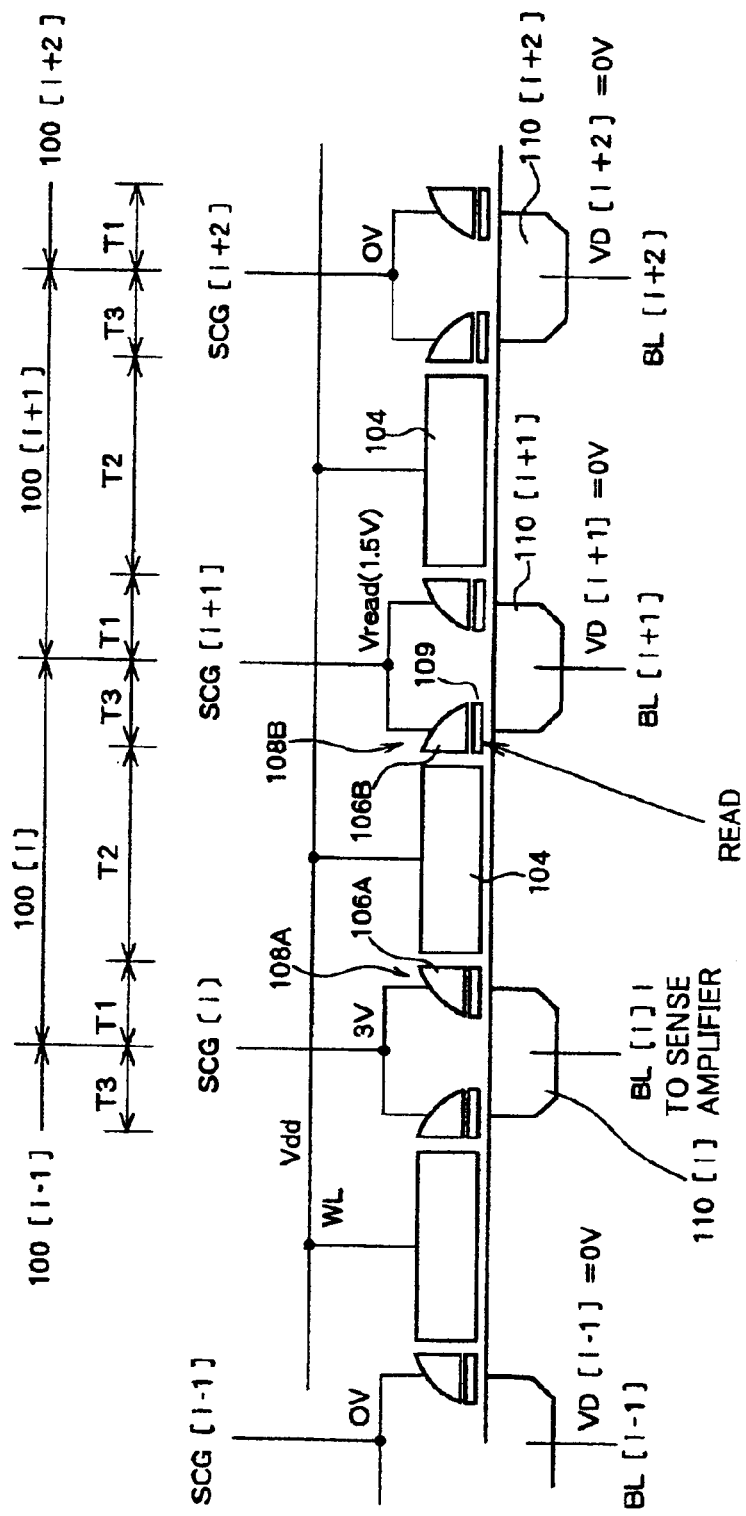
FIG. 15 is a schematic diagram explaining a data reading operation in the nonvolatile semiconductor storage device shown in FIG. 1.
Figure 16:
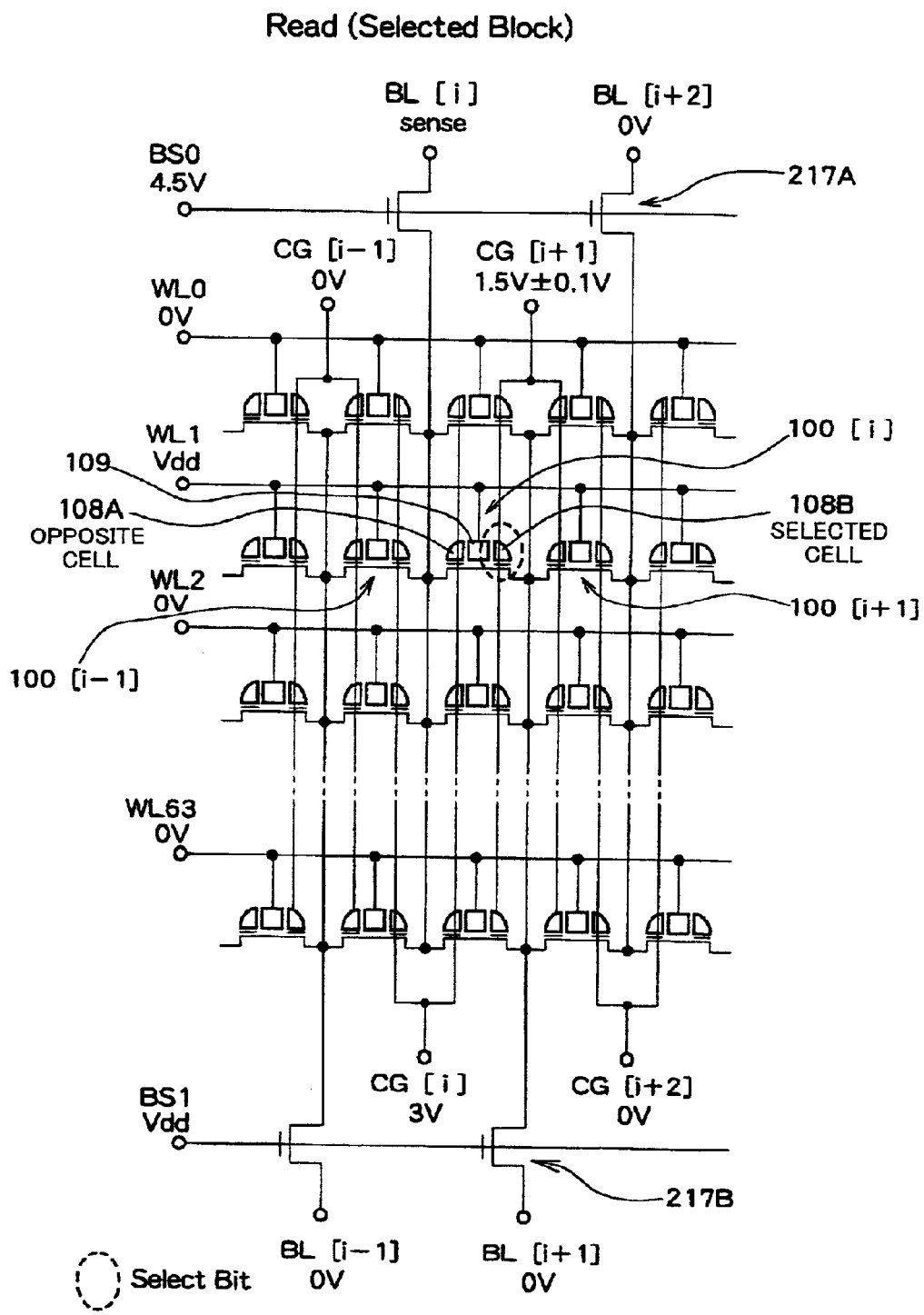
FIG. 16 is a schematic diagram explaining the settings of voltages within the selected block in the data read mode.

In describing the operation of the memory cell 100, there will be first explained the settings of the potentials of the various positions of the four memory cells 100 [i−1], [i], [i+1], [i+2] which are adjacent to one another in a certain selected block (selected small block 215) within, for example, the sector 0 as shown in FIG. 15. FIG. 15 is a diagram for explaining a case where data is read out in a reverse read mode from the MONOS memory element 108B (selected cell) on the right side of that word gate 104 of the memory cell 100 [i] which is connected to the word line WL1, while FIG. 16 shows the settings of voltages in the selected block on that occasion.

Here, the "reverse read" reads data by sensing current which flows through the bit line BL [i], by employing as a source the bit line BL [i+1] which is connected to the right selected cell 108B of the memory cell 100 [i], and as a drain the bit line BL [i] which is connected to the opposite cell 108A of the memory cell 100 [i].

The present invention can be applied also to forward read. In the case of the forward read, data is read by sensing current which flows through the bit line BL [i+1], by employing as a drain the bit line BL [i+1] which is connected to the right selected cell 108B of the memory cell 100 [i], and as a source the bit line BL [i] which is connected to the opposite cell 108A of the memory cell 100 [i].

The read operation will be described below by taking the reverse read as an example. In this case, the voltage Vdd (for example, 1.5V) is applied as a reading word line selection voltage to the word gate WL1 which lies at the same row as that of the memory cell 100 [i], thereby to turn ON the transistors T2 of that row. Besides, an override voltage (VP2 in FIG. 8 =3V by way of example) is applied through the sub control gate line SCG [i] to the left control gate 106A (the opposite cell) of the memory cell 100 [i], thereby to turn ON the transistor T1 corresponding to the MONOS memory element 108A. A read voltage Vread (VP1 in FIG. 8=1.5 V by way of example) is applied as the voltage VCG of the right control gate 106B of the memory cell 100 [i].

On this occasion, the operation of the transistor T3 corresponding to the MONOS memory element 108B is divided as stated below, depending upon whether or not charges are stored in the right MONOS memory element 108B (selected cell) of the word gate 104.

Figure 17:
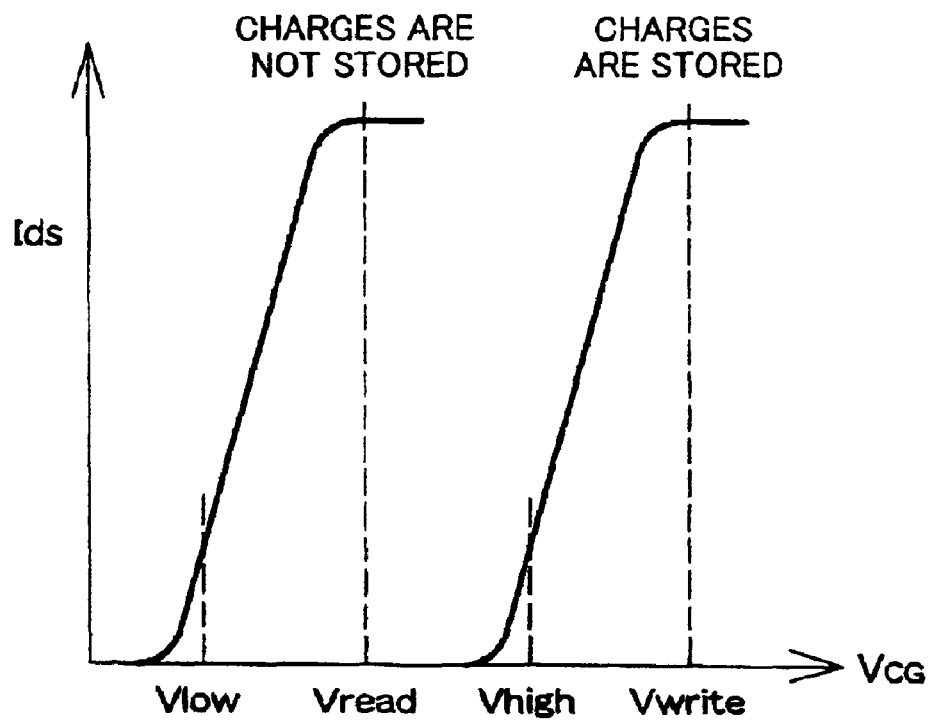
FIG. 17 is a characteristic diagram showing the relationships between a control gate voltage VCG and a source/drain current Ids in the memory cells shown in FIG. 1.

FIG. 17 shows the relationships between the applied voltage to the right control gate (the selected cell side) 106B of the memory cell 100 [i] and the current Ids flowing through the source/drain path of the transistor T3 corresponding to the MONOS memory element 108B (selected cell) which is controlled by the control gate 106B.

As shown in FIG. 17, in a case where no charges are stored in the MONOS memory element 108B (selected cell), the current Ids begins to flow when the control gate voltage VCG exceeds a low threshold voltage Vlow. In contrast, in a case where charges are stored in the MONOS memory element 108B (selected cell), the current Ids does not begin to flow unless the control gate potential VCG of the selected side exceeds a high threshold voltage Vhigh.

Here, the voltage Vread which is applied to the control gate 106B of the selected side in the data read mode is set at substantially the middle voltage between the two threshold voltages Vlow and Vhigh.

Accordingly, the current Ids flows in the case where no charges are stored in the MONOS memory element 108B (selected cell), and it does not flow in the case where the charges are stored in the MONOS memory element 108B (selected cell).

Here, as shown in FIG. 16, in the data read mode, the bit line BL [i] (impurity layer 110 [i]) connected to the opposite cell is connected to the sense amplifier, and the potentials VD [i−1], [i+1], [i+2] of the other bit lines BL [i−1], [i+1], [i+2] are respectively set at 0V. Thus, since the current Ids flows in the absence of the charges in the MONOS memory element 108B (selected cell), a current of, for example, at least 25 μA flows to the bit line BL [i] of the opposite side through the transistors T1, T2 in the ON states. In contrast, since the current Ids does not flow in the presence of the charges in the MONOS memory element 108B (selected cell), a current which flows to the bit line BL [i] connected to the opposite cell becomes less than, for example, 10 nA in spite of the ON states of the transistors T1, T2. Therefore, data can be read out of the MONOS memory element 108B (selected cell) of the memory cell 100 [i] in such a way that the current flowing to the bit line BL [i] of the opposite side is detected by the sense amplifier.

Note that in this embodiment, as shown in FIG. 16, the bit line selection transistors (N-type MOS transistors) 217A are respectively connected to the bit lines BL [i], [i+2], and the bit line selection transistors 217B to the bit lines BL [i−1], [i+1].

Each of these selection transistors 217A, 217B is difficult of holding its current drivability high, in relation to its size, and it has, for example, a channel width W=0.9 μm and a channel length L=0.8 μm in this embodiment.

Since the above current needs to be ensured for the bit line BL [i] connected to the sense amplifier, the gate voltage BS0 of the bit line selection transistor 217A is set at a high voltage of, for example, 4.5V (=VP2) by the circuit shown in FIG. 11.

On the other hand, the voltage of the source side of the MONOS memory element 108A of the selected side in FIG.

16 becomes a voltage close to 0V (on the order of several tens to several hundred mV). Consequently, the back gate of the bit line selection transistor 217B exerts little influence, and hence, the gate voltage BS1 thereof is set at the voltage Vdd (=VP1) by a circuit similar to the circuit in FIG. 11. Since this gate need not be fed with the voltage of 4.5V, the load of the unshown booster circuit (charge pump) for generating the voltage of 4.5V can be lightened.

Assuming that the selected cell be the left nonvolatile memory element 108A of the memory cell 100 [i] in FIG. 16, the bit line BL [i] serves as a source in the reverse read, and the bit line BL [i+1] connected to the opposite cell 108B serves as a drain connected to the sense amplifier. In this case, therefore, the gate voltage BS0 of the bit line selection transistor 217A may be set at the voltage Vdd, and the gate voltage BS1 of the bit line selection transistor 217B at 4.5V.

Regarding the unselected cell in the selected block, voltages are set as listed in Table 2.

Figure 18:
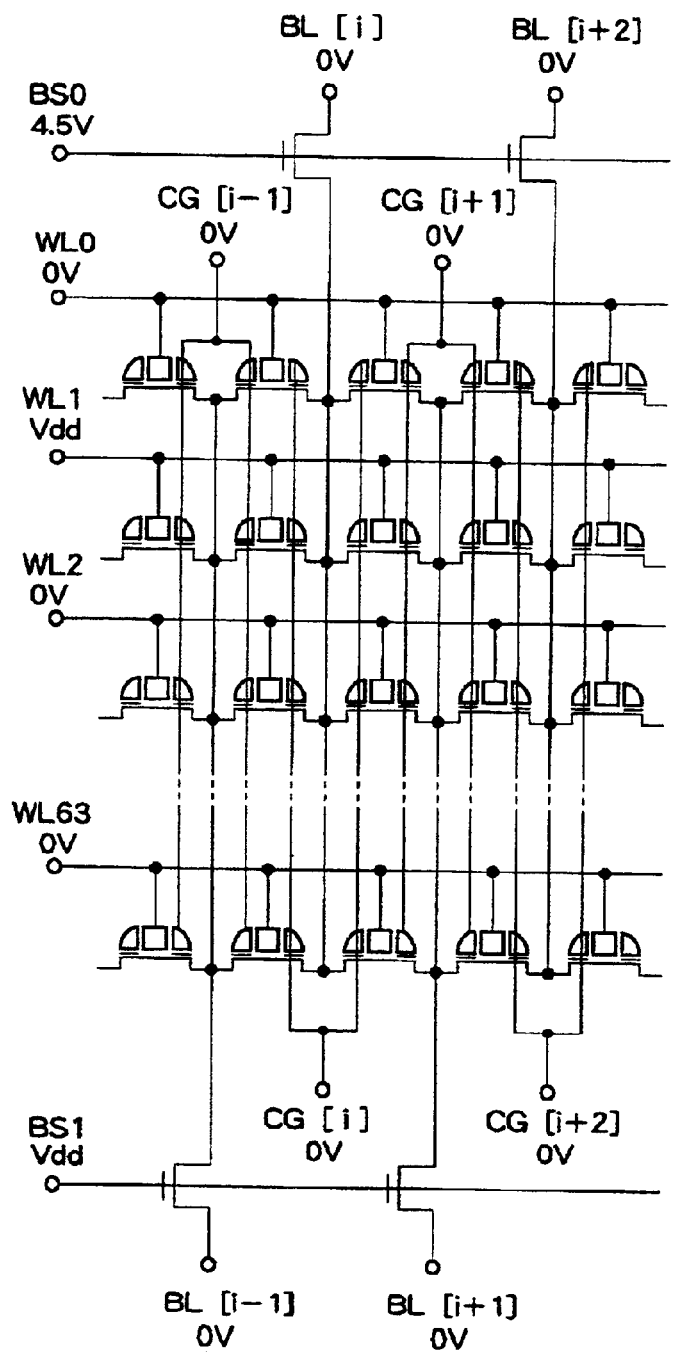
FIG. 18 is a schematic diagram explaining the settings of voltages within the unselected opposite block in the data read mode.

Next, in the opposite block (small block 215) within the sector 1 as opposes to the selected block within the sector 0, voltages are set as listed in Table 3, and the situation is shown in FIG. 18. Referring to FIG. 18, the voltages of the respective word lines WL and the gate voltages of the bit line selection transistors are shared by the sectors 0, 1, and they are therefore set at the same voltages as in the selected block shown in FIG. 16. The bit lines are all set at 0V.

Figure 19:
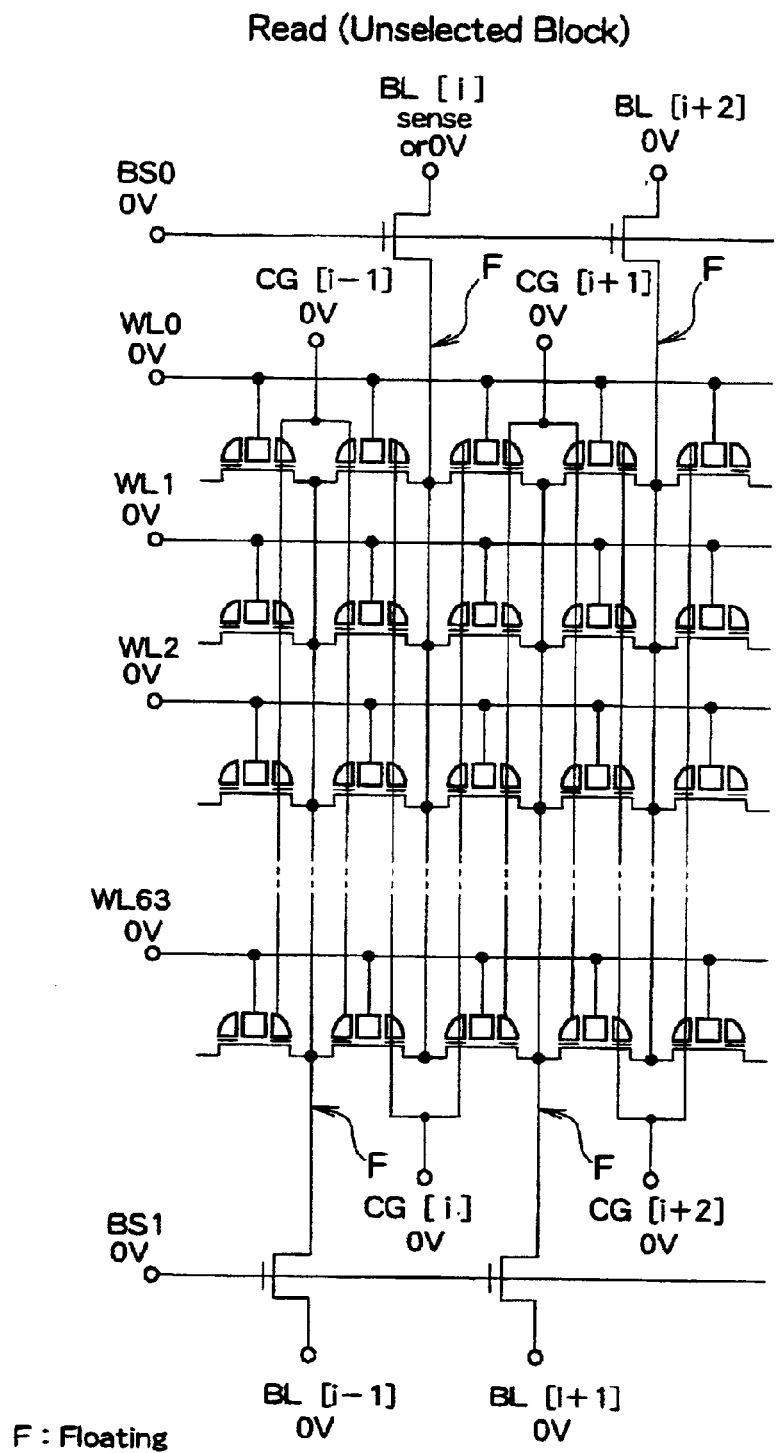
FIG. 19 is a schematic diagram explaining the settings of voltages within the unselected block except the opposite block, in the data read mode.

In each of the unselected blocks (small blocks 215) existing in the sectors 0 to 63, except the selected block and the opposite block, voltages are set as listed in Table 3, and the situation is shown in FIG. 19.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states.

Programming of Memory cell

Figure 20:
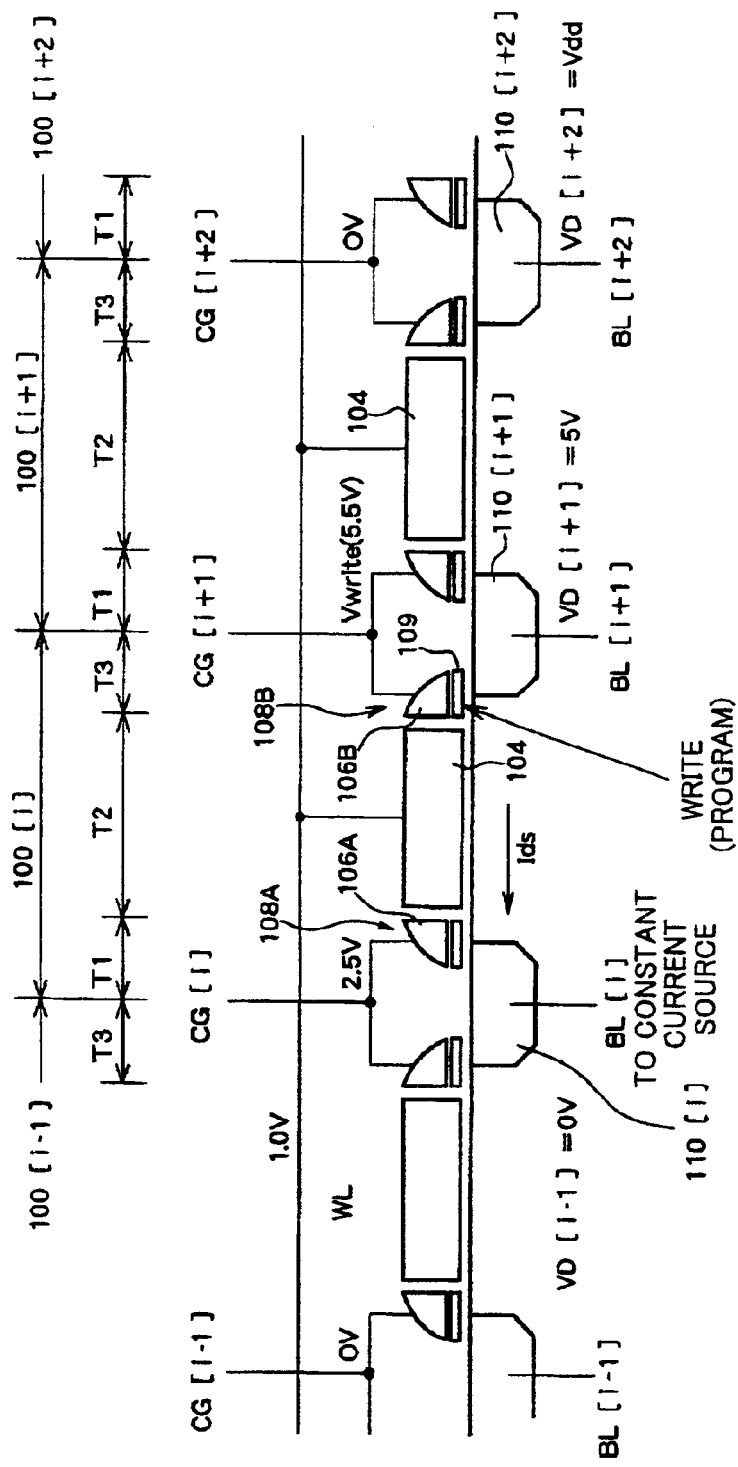
FIG. 20 is a schematic diagram explaining a data writing (programming) operation in the nonvolatile storage device shown in FIG. 1.
Figure 21:
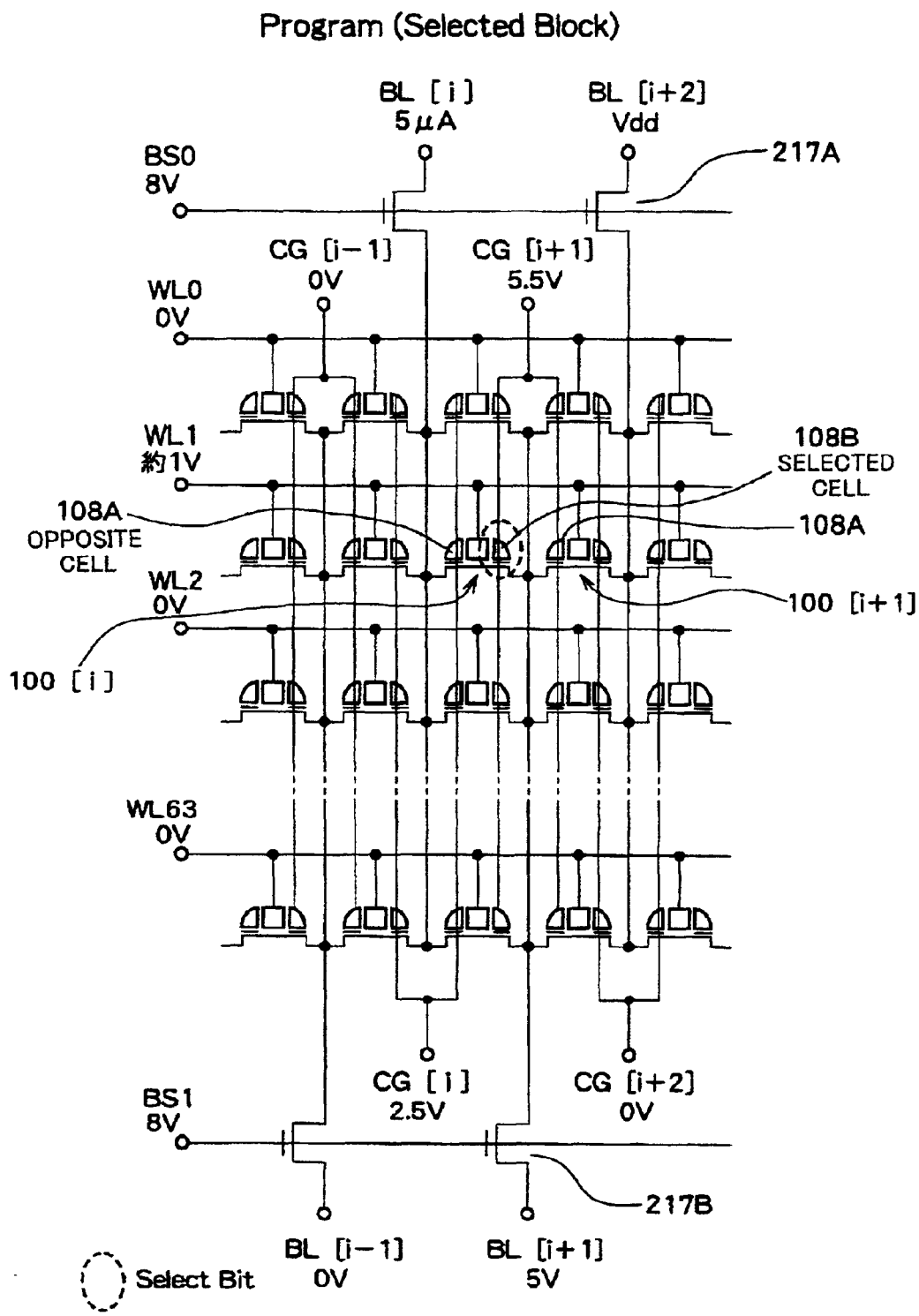
FIG. 21 is a schematic diagram explaining the settings of voltages within the selected block in the data program mode.

FIG. 20 is a diagram for explaining the data programming of the MONOS memory element 108B (selected cell) on the right side of the word gate 104 of the memory cell 100 [i] connected to the word line WL1, while FIG. 21 shows the situation of the settings of voltages in the selected block. The data programming operation is preceded by a data erasing operation which will be stated later.

In FIG. 20, as in FIG. 15, the potential of the sub control gate line SCG [i] is set at the override potential (VP1 in FIG. 8=2.5V by way of example), and the potentials of the sub control gate lines SCG [i−1], [i+2] are set at 0V. Here, the "override potential" is a potential which is required for causing a program current to flow by turning ON the transistor T1 correspondent to the left MONOS memory element 108A (opposite cell opposing to the selected cell) of the memory cell 100 [i], irrespective of whether or not the MONOS memory element 108A is to be programmed. Besides, the potentials of the word gates 104 in FIG. 21 are set at a programming word line selection voltage of, for example, about 1.0V lower than the supply voltage Vdd by the word line WL1. Further, the potential of the right control gate 108B (selected cell) of the memory cell 100 [i+1] is set at a write voltage Vwrite (VP2 in FIG. 8=5.5V by way of example) being a programming control gate voltage and shown in FIG. 4, through the sub control gate line SCG [i+1].

Figure 22:
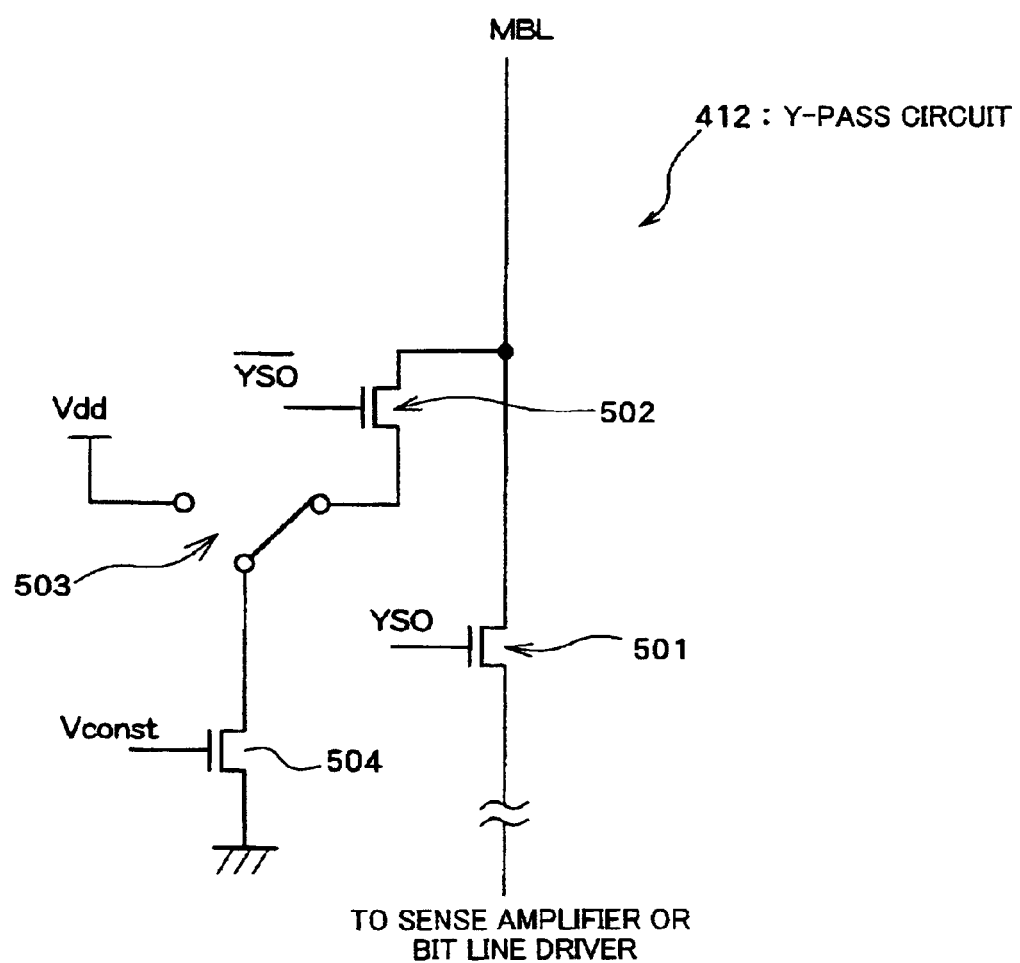
FIG. 22 is a circuit diagram schematically showing a Y-pass circuit which is connected to a bit line.

Next, the settings of the voltages of the bit line BL will be described with reference to FIG. 22. FIG. 22 schematically shows the interior of the Y-pass circuit 412 which is connected to the main bit line MBL.

Disposed in the Y-pass circuit 412 are a first transistor 501 for connecting the main bit line MBL to the sense amplifier or the bit line driver, and a second transistor 502 for connecting the same to any other path. Complementary signals YS0 and bar-YS0 are respectively inputted to the first and second transistors 501 and 502.

The node of the supply voltage Vdd (1.8V), and a constant current source 504 for causing a constant current of, for example, 5 µA are disposed for the source of the second transistor 502 through a switch 503.

In the program mode, the voltage VD [i+1] of the bit line BL [i+1] in FIGS. 20 and 21 is connected to the bit line driver through the first transistor 501 in FIG. 22 and is set at, for example, 5V being a programming bit line voltage.

Besides, the bit line BL [i+2] is set at the voltage Vdd through the second transistor 502 and the switch 503 in FIG. 22.

Both the bit lines BL [i−1], [i] are connected to the constant current source 504 through the second transistor 502 and the switch 503 in FIG. 22. However, the MONOS cell connected to the bit line BL [i−1] turns OFF because of the 0V of its control gate line CG [i−1], and no current flows therethrough, so that it is set at 0V through the constant current source 504.

Thus, the transistors T1, T2 of the memory cell 100 [i] turn ON, respectively, and the current Ids flows toward the bit line BL [i], while at the same time, channel hot electrons (CHE) are trapped into the ONO film 109 of the MONOS memory element 108B. In this way, the programming operation of the MONOS memory element 108B is performed to write data "0" or "1".

On this occasion, there is also a method in which the programming word line selection voltage is set at 0.77V or so, not at about 1V, so as to bring the bit line BL [i] to 0V. In this embodiment, although the source/drain current is increased by raising the programming word line selection voltage to about 1V, the current which flows into the bit line BL [i] in the program mode is limited by the constant current source 504. Therefore, the voltage of the bit line BL [i] can be set at the optimum value (within a range of 0 to 1 V, and about 0.7V in this embodiment), and the programming operation can be optimally performed.

On account of the above operation, the voltage of 5.5V is applied also to the control gate of the right nonvolatile memory element 108A of the unselected memory cell 100 [i+1]. On this occasion, the right control gate CG [i+2] of the memory cell 100 [i+1] is set at 0V, so that any current does not essentially flow between the source and drain (between the bit lines) of the memory cell 100 [i+1]. Since, however, the voltage of 5V is applied to the bit line BL [i+1], any high electric field exerted between the source and drain (between the bit lines) of the memory cell 100 [i+1] causes a punch-through current to flow and gives rise to a write disturbance. Therefore, the write disturbance is prevented by setting the voltage of the bit line BL [i+2] at, for example, Vdd, not at 0V, and lessening the potential difference between the source and drain. Moreover, the voltage of the bit line BL [i+2] is set at the voltage which exceeds 0V, and which is preferably, at least, equal to the word line selection voltage in the program mode, whereby the transistor T2 of the memory cell [i+1] becomes difficult to turn ON. The disturbance can be prevented also this fact.

Besides, since the voltage of 5V needs to be fed to the bit line BL [i+1], the voltage VP1=VP2=8V is applied to the gate of the bit line selection transistor 217B by a circuit similar to that shown in FIG. 11. On the other hand, the voltage of 8V (VP1=VP2=8V in FIG. 11) is similarly applied to the gate of the bit line selection transistor 217A. Since the bit line BL [i+2] needs to be set at Vdd for the above reason, a voltage higher than Vdd needs to be applied also to the gate of the transistor 217A, and hence, the same voltage of 8V as the gate voltage of the transistor 217B is used. Note that the gate voltage of the bit line selection transistor 217A may be higher than (Vdd+Vth).

Regarding the unselected cell in the selected block, voltages are set as listed in Table 2.

Figure 23:
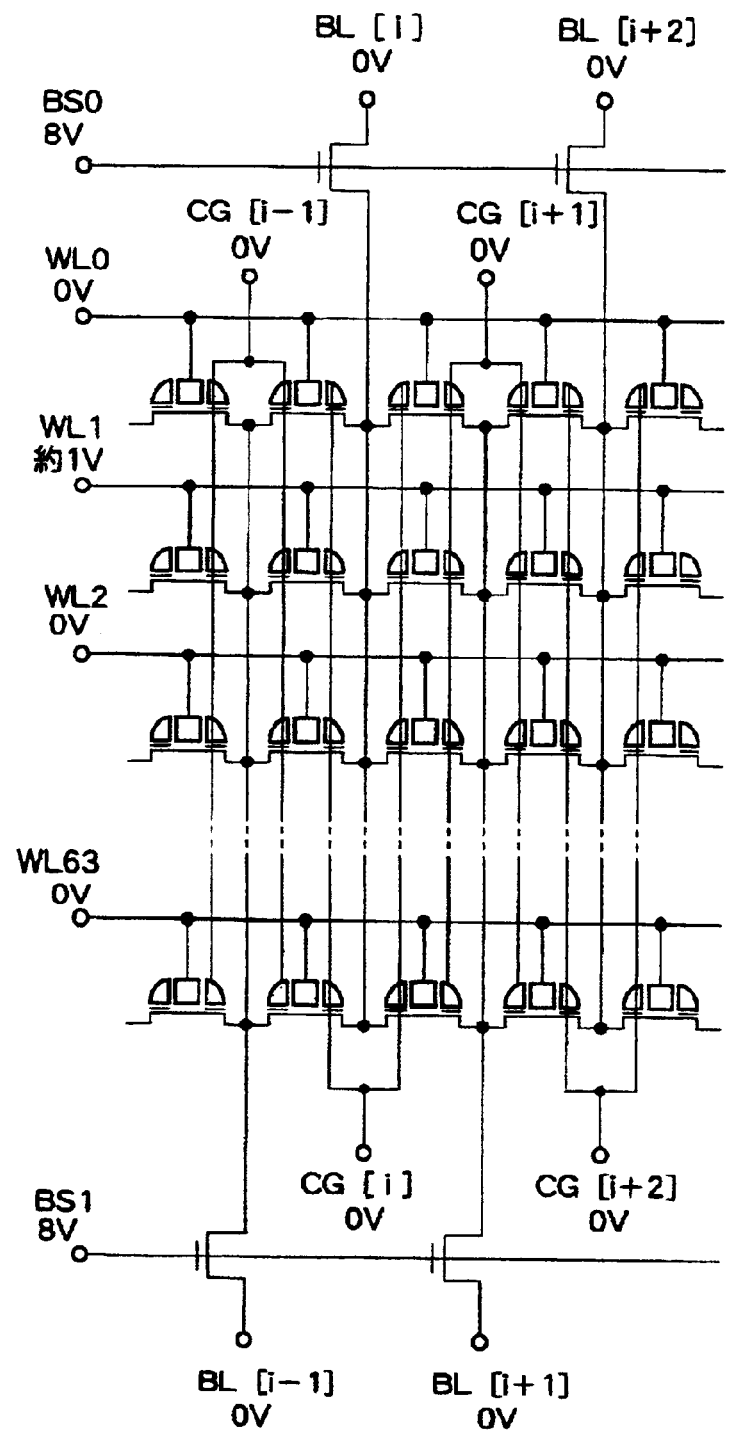
FIG. 23 is a schematic diagram explaining the settings of voltages within the unselected opposite block in the data program mode.

Next, in the opposite block (small block 215) within the sector 1 as opposes to the selected block within the sector 0, voltages are set as listed in Table 3, and the situation is shown in FIG. 23. Referring to FIG. 23, the voltages of the respective word lines WL and the gate voltages of the bit line selection transistors are shared by the sectors 0, 1, and they are therefore set at the same voltages as in the selected block shown in FIG. 20. The bit lines are all set at 0V.

Figure 24:
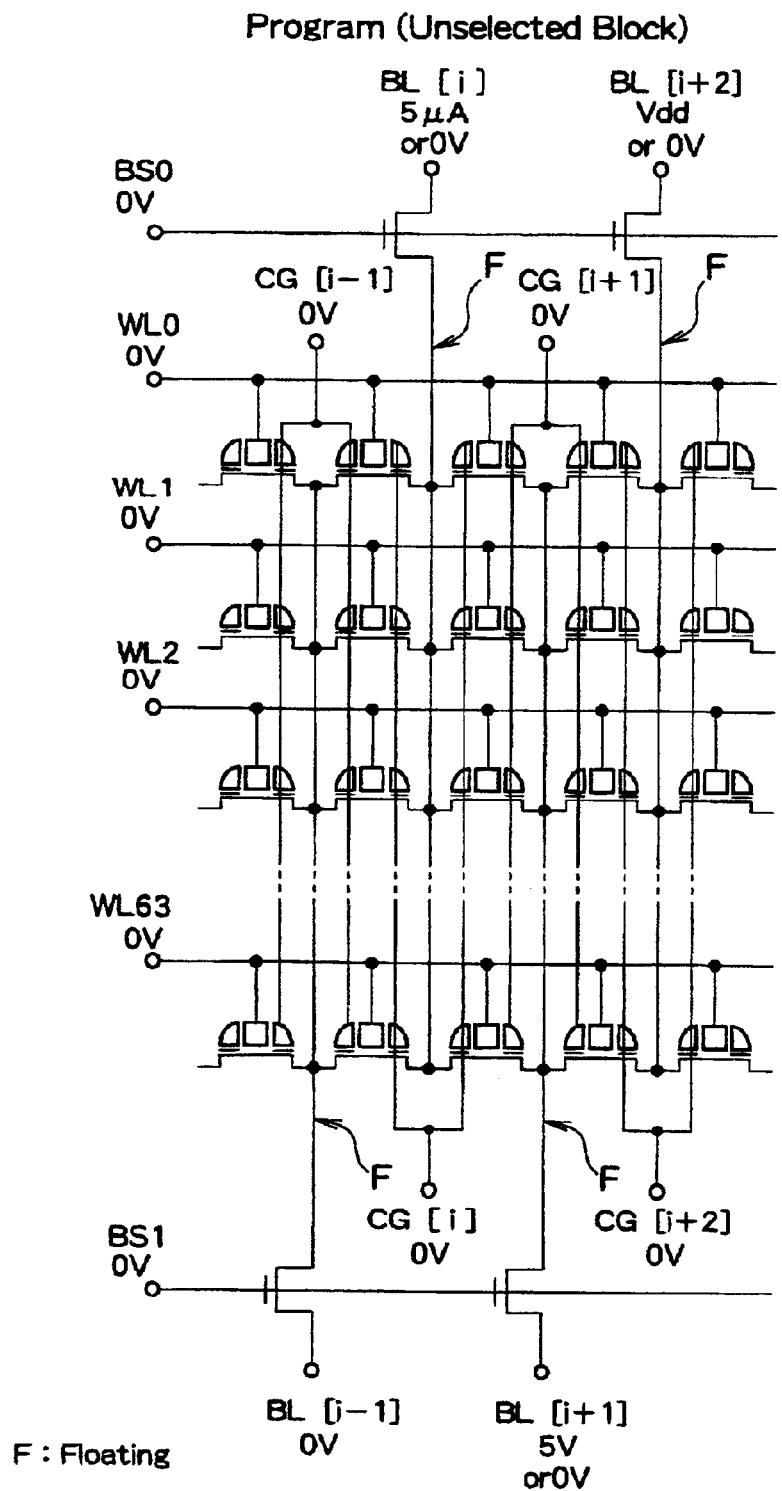
FIG. 24 is a schematic diagram explaining the settings of voltages within the unselected block except the opposite block, in the data program mode.

In each of the unselected blocks (small blocks 215) existing in the sectors 0 to 63, except the selected block and the opposite block, voltages are set as listed in Table 3, and the situation is shown in FIG. 24.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states.

Figure 25:
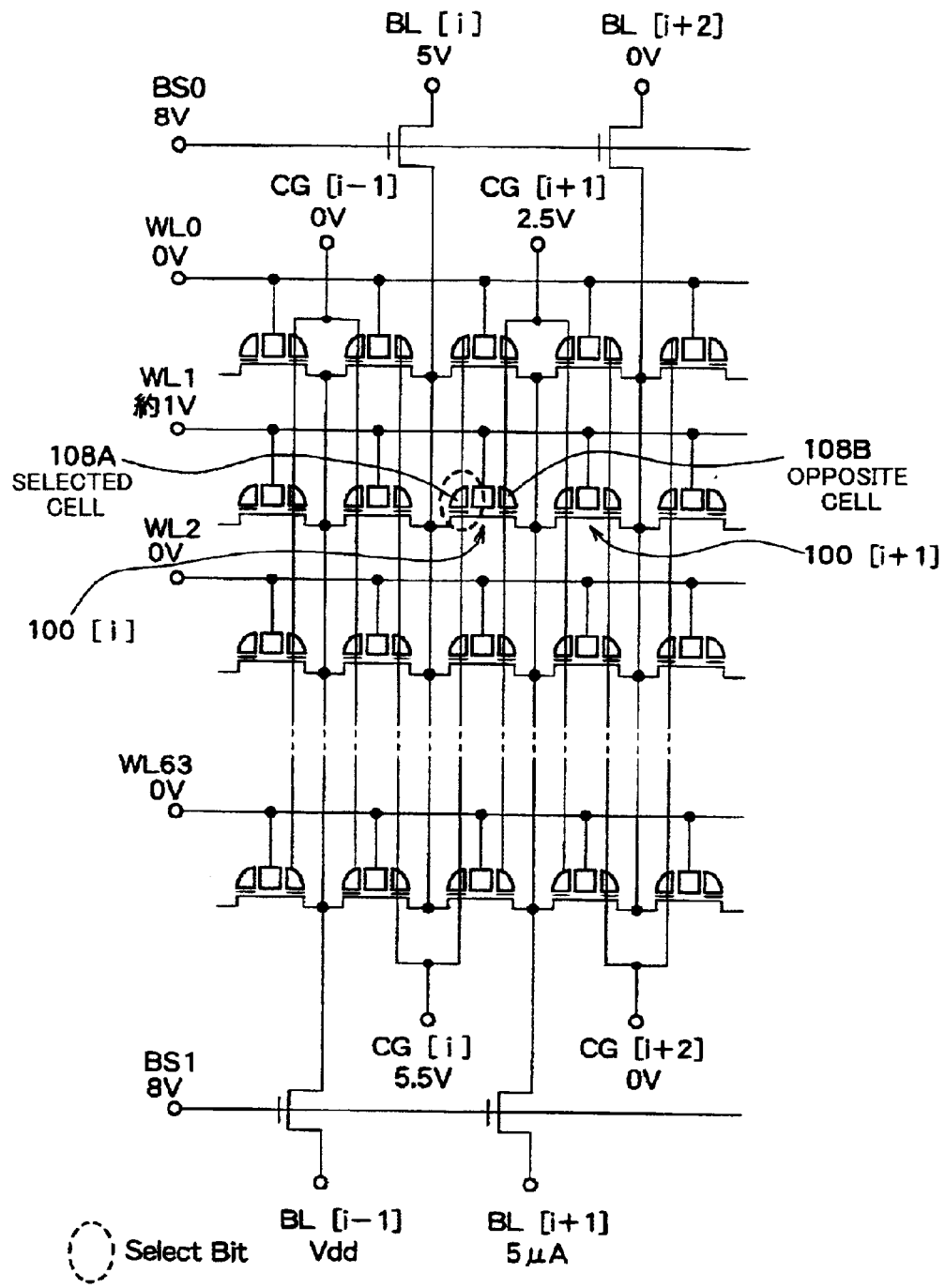
FIG. 25 is a schematic diagram explaining the settings of voltages within the selected block in the data program mode, for the memory element of the selected side differing from that in FIG. 21.

In order to program the left MONOS memory element 108A of the memory cell 100 [i], the potentials of the various positions of the memory cells 100 [i–1], [i], [i+1] may be set as shown in FIG. 25.

Data Erasing of Memory Cell

Figure 26:
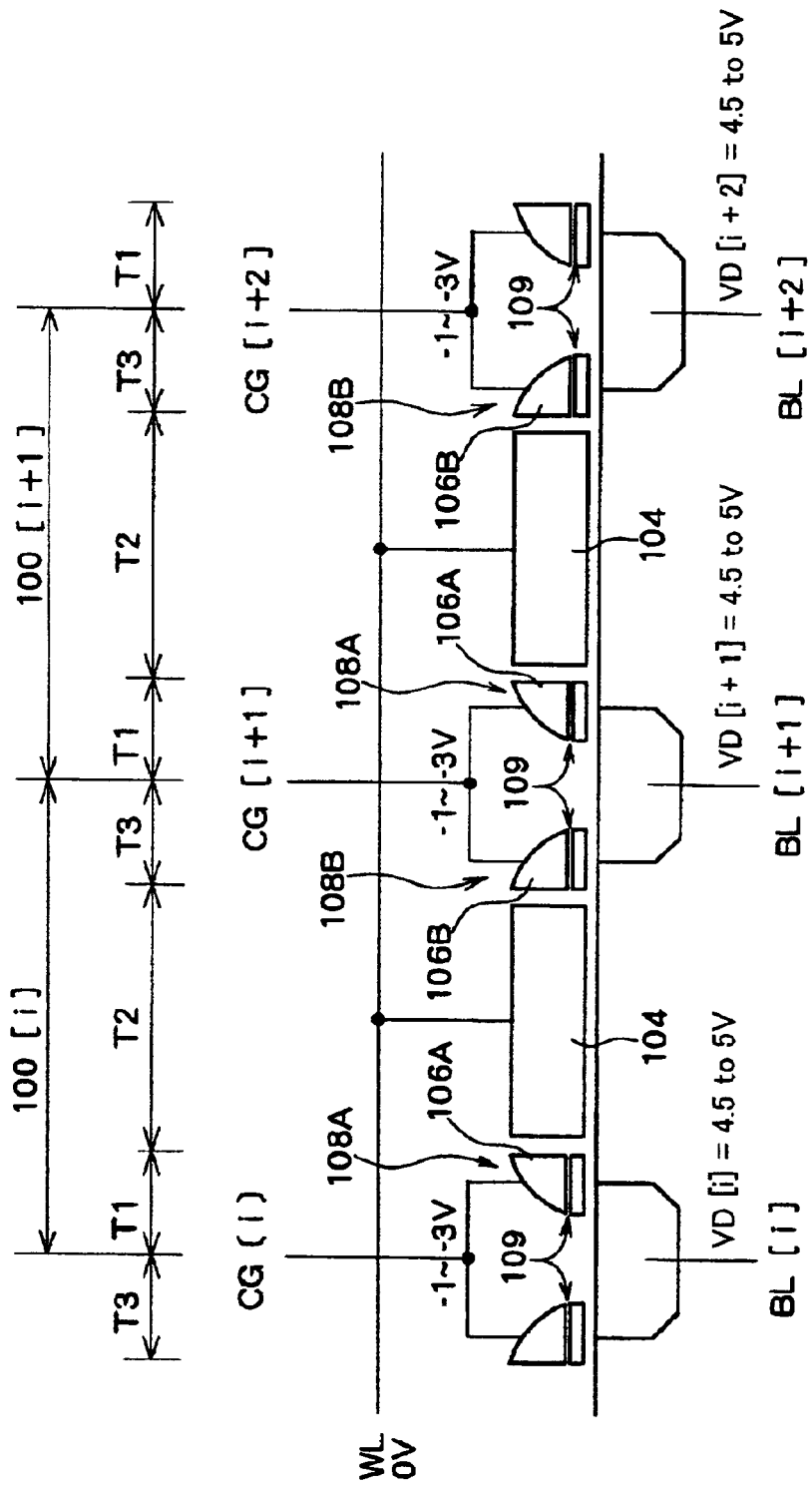
FIG. 26 is a schematic diagram explaining a data erasing operation in the nonvolatile storage device shown in FIG. 1.
Figure 27:
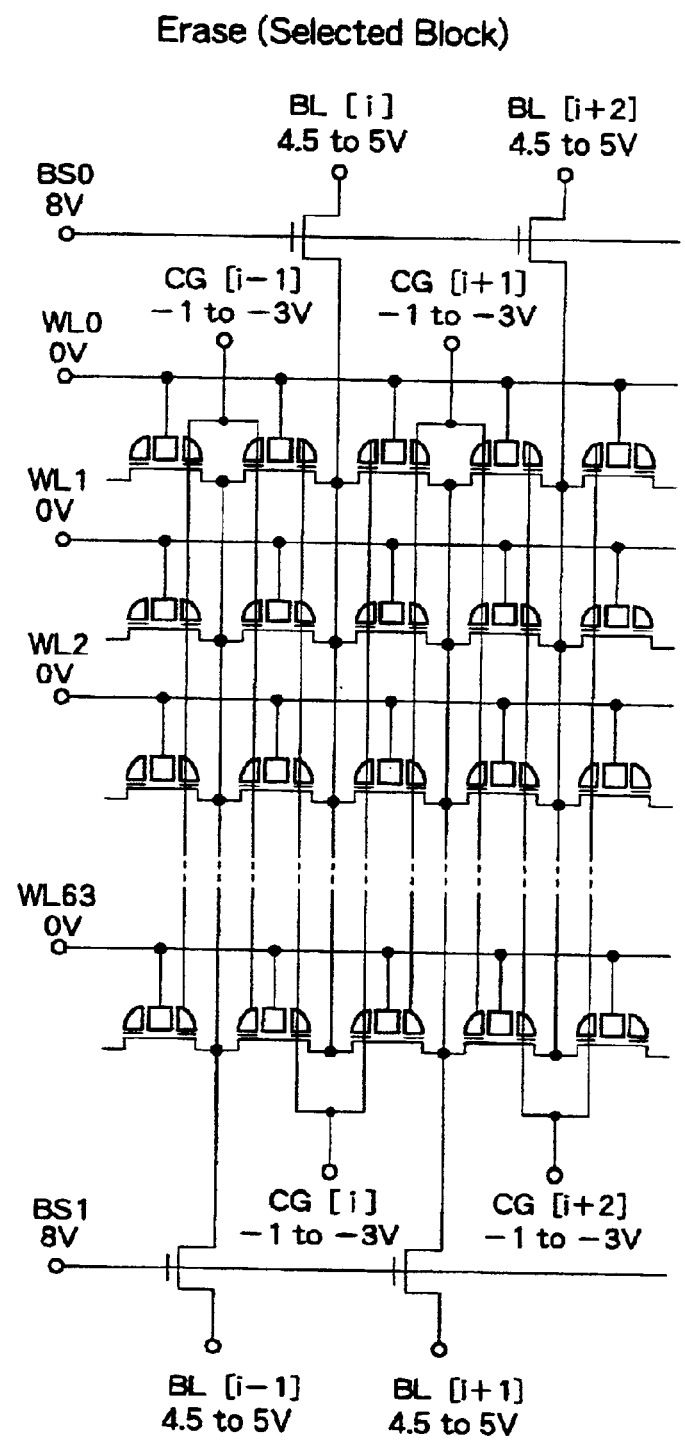
FIG. 27 is a schematic diagram explaining the settings of voltages within the selected block in the data erase mode.

FIG. 26 is a schematic diagram in the case of erasing data collectively from all the memory cells in the sector 0, and the situation of set voltages for some of the memory cells in the sector 0 is shown in FIG. 27.

Referring to FIG. 26, the potentials of the word gates 104 are set at 0V by the word line WL, and the potentials of the control gates 106A, 106B are set at an erasing control gate line voltage VNCG of, for example, –1V to –3V or so by the sub control gate lines SCG [i–1], [i], [i+1], [i+2]. Further, the potentials of the bit lines BL [i–1], [i], [i+1], [i+2] are set at an erasing bit line voltage of, for example, 4.5V to 5V by the bit line selection transistors 217A, 217B and the bit line drivers.

Thus, electrons having been trapped in the ONO films 109 of the MONOS memory elements 108A, 108B are extracted away by a tunnel effect on the basis of an electric field which is formed by the erasing control gate voltage applied to the control gates, and the erasing bit line voltage applied to the bit lines. In this way, it is permitted to simultaneously erase data from the plurality of memory cells. Incidentally, an erasing operation may well be such that, unlike in the foregoing, hot holes are formed by band-band tunneling at the surfaces of impurity layers serving as bits, thereby to extinguish electrons having been stored.

Besides, the collective erasing of data within the sector is not restrictive, but data may well be erased in time division.

Figure 28:
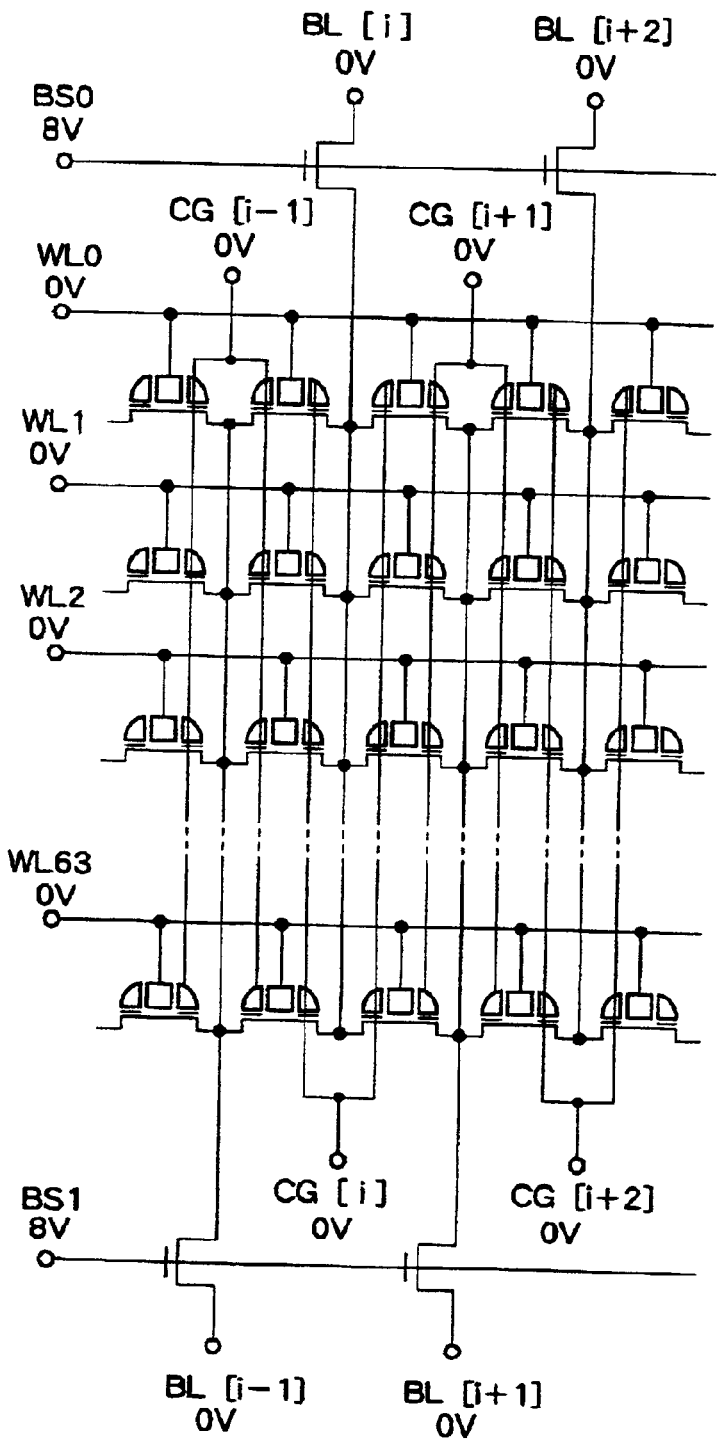
FIG. 28 is a schematic diagram explaining the settings of voltages within the unselected opposite block in the data erase mode.

Next, in the opposite block (small block 215) within the sector 1 as opposes to the selected block within the sector 0, voltages are set as listed in Table 3, and the situation is shown in FIG. 28. Referring to FIG. 28, the voltages of the respective word lines WL and the gate voltages of the bit line selection transistors are shared by the sectors 0, 1, and they are therefore set at the same voltages as in the selected block shown in FIG. 24. The bit lines are all set at 0V. In the cells within the opposite block, both the control gate line CG and the bit line BL are 0V, so that no disturbance occurs.

Figure 29:
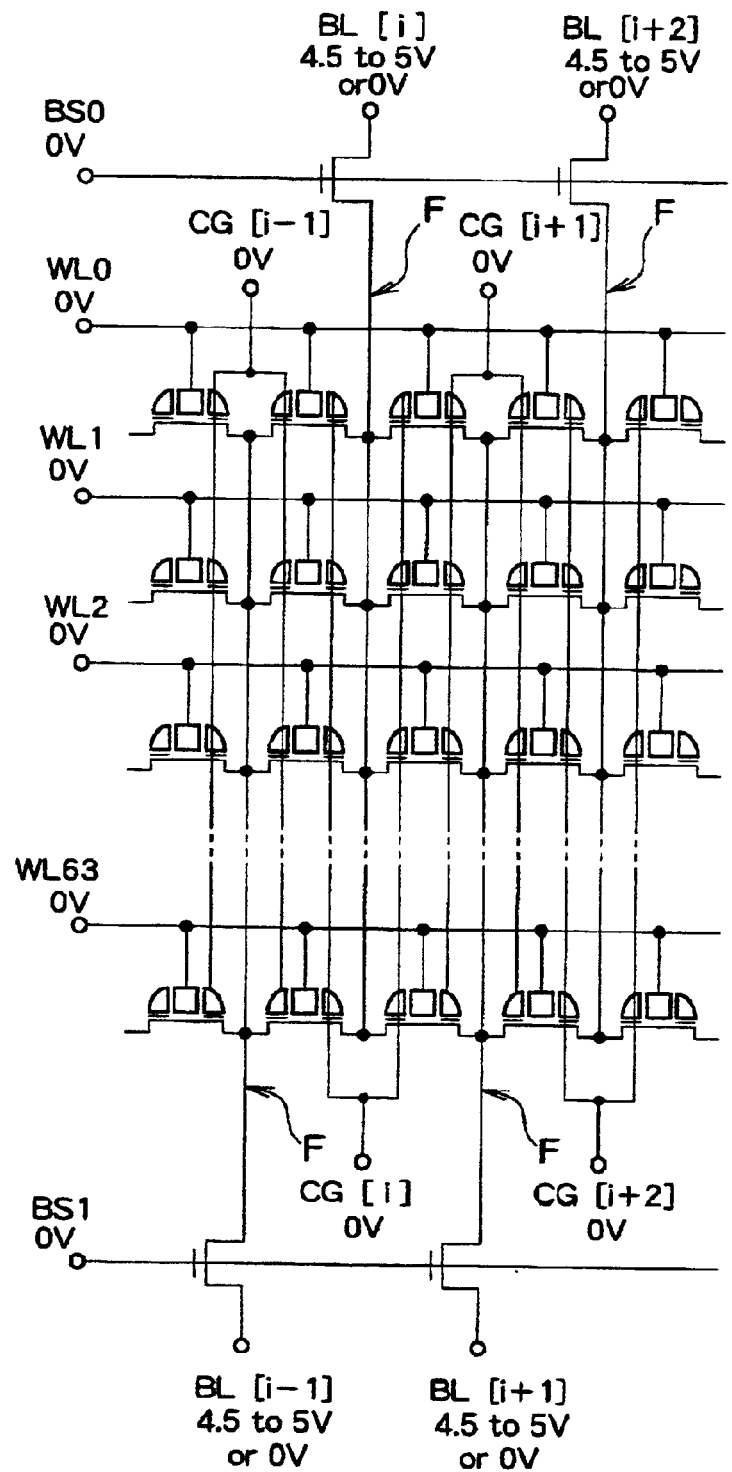
FIG. 29 is a schematic diagram explaining the settings of voltages within the unselected block except the opposite block, in the data erase mode.

In each of the unselected blocks (small blocks 215) existing in the sectors 0 to 63, except the selected block and the opposite block, voltages are set as listed in Table 3, and the situation is shown in FIG. 29.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states. Since, however, the voltages of the bit lines BL are very close to 0V, no disturbance occurs in the cells within the unselected block.

Note that the present invention is not restricted to the foregoing embodiment, but it can be variously modified within the scope of the purport thereof.

By way of example, the structure of the nonvolatile memory elements 108A, 108B is not restricted to the MONOS structure. The present invention is applicable to a nonvolatile semiconductor storage device employing any of other various memory cells each of which can trap charges independently in two portions by one word gate 104 and first and second control gates 106A and 106B.

Besides, the dividing number of each sector area, the dividing numbers of each large block and each small block, and the number of the memory cells in each small memory block are mere examples in the foregoing embodiment, and other various modifications are possible. The dividing number of each large block has been determined to be eight from the restriction of a metal wiring pitch. If the metal wiring pitch can be narrowed, the dividing number can be increased more. By way of example, when each large block is divided by 16, the load capacitance (gate capacitance) of one control gate line decreases still further, and hence, a drive of higher speed becomes possible. Since, however, the number of the main control gate lines increases due to the division by 16, it is unavoidable to narrow the lines and spaces or to enlarge a device area. Moreover, since also the number of the control gate drivers increases, an area enlarges to that extent.

What is claimed is:

1. A nonvolatile semiconductor device comprising:
   a memory cell array region in which a plurality of memory cells are arranged in a row direction and a column direction, each of the memory cells having first and second nonvolatile memory elements and being controlled by one word gate and first and second control gates; and
   a control gate drive section which drives the first and second control gates of each of the memory cells within the memory cell array region,
   wherein the memory cell array region includes a plurality of sector areas which are formed by dividing the memory cell array region in the row direction,
   wherein each of the plurality of sector areas includes a plurality of block areas which are formed by dividing each of the sector areas in the column direction, and
   wherein the control gate drive section includes a plurality of control gate drivers each of which corresponds to each of the plurality of block areas, and each of the plurality of control gate drivers sets potentials of the first and second control gates in corresponding one of the block areas, independently of the other block areas.

2. The nonvolatile semiconductor device as defined by claim 1,
   wherein each of the plurality of block areas is provided with first to fourth control gate lines respectively connected with every fourth line among sub control gate lines, each of the sub control gate lines connecting the first control gate of one of the memory cells with the second control gate of adjacent memory cell among the memory cells arranged in the row direction, and wherein each of the plurality of block areas includes first to fourth control gate drivers which drive the first to fourth control gate lines, respectively.

3. The nonvolatile semiconductor storage device as defined by claim 1,
wherein the plurality of control gate drivers are disposed in at least one local driver area adjacent to the block areas in the row direction.

4. The nonvolatile semiconductor storage device as defined by claim 3,
wherein a word line driver is disposed in the local driver area, the word line driver driving a word line connected to the word gate of each of the memory cells arranged in the row direction in each of the block areas.

5. The nonvolatile semiconductor storage device as defined by claim 3,
wherein a plurality of sub bit lines which extend in the column direction are provided in each of the plurality of block areas,
wherein a plurality of main bit lines are formed extending over the plurality of block areas in the column direction, and respectively connected to the plurality of sub bit lines in each of the plurality of block areas, and
wherein a plurality of bit line selection switching elements, each selecting connection or non-connection, are disposed at respective connection points between the main bit lines and the sub bit lines.

6. The nonvolatile semiconductor storage device as defined by claim 5,
wherein a bit line selection driver, which drives the bit line selection switching elements arranged in the block areas, is disposed in the local driver area.

7. The nonvolatile semiconductor storage device as defined by claim 3,
the block areas in an even-numbered sector area among the sector areas and the block areas in an odd-numbered sector area among the sector areas are disposed adjacent each other in the row direction between two of the local driver areas among the local driver areas.

8. The nonvolatile semiconductor storage device as defined by claim 7,
wherein a plurality of word lines are respectively formed extending over the block areas in the even-numbered sector area and the block areas in the odd-numbered sector area.

9. The nonvolatile semiconductor storage device as defined by claim 8,
wherein a first word line driver which drives part of the plurality of word lines is disposed in one of the local driver areas adjacent to the block areas in the odd-numbered sector area, and a second word line driver which drives the other part of the plurality of word lines is disposed in another of the local driver areas adjacent to the block areas in the even-numbered sector area.

10. The nonvolatile semiconductor storage device as defined by claim 9,
wherein the first word line driver and the second word line driver are respectively connected with every second line among the word lines arranged in the column direction.

11. The nonvolatile semiconductor storage device as defined by claim 7, further comprising:
a plurality of first bit line selection switching elements and a plurality of second bit line selection switching elements, the first and second bit line selection switching elements respectively connected to every second line among a plurality of sub bit lines arranged in the block areas within the odd-numbered sector area and the block areas within the even-numbered sector area;
a first bit line selection driver which drives the plurality of first bit line selection switching elements is disposed in one of the local driver areas which is adjacent to the block areas in the odd-numbered sector area; and
a second bit line selection driver which drives the plurality of second bit line selection switching elements is disposed in another of the local driver areas which is adjacent to the block areas in the even-numbered sector area.

12. The nonvolatile semiconductor storage device as defined by claim 1,
wherein each of the first and second nonvolatile memory elements includes an ONO film formed of an oxide film (O), a nitride film (N) and an oxide film (O), as a trap site for electric charges, and data is programmed in the trap site.

* * * * *